US012796022B2

(12) United States Patent
Chiang et al.

(10) Patent No.: US 12,796,022 B2
(45) Date of Patent: Nov. 10, 2026

(54) GATE ALL AROUND SEMICONDUCTOR STRUCTURE WITH DIELECTRIC STRUCTURES OF DIFFERENT WIDTHS AND METHOD FOR FORMING THE SAME

(71) Applicant: Taiwan Semiconductor Manufacturing Company, Ltd., Hsinchu (TW)

(72) Inventors: Kuo-Cheng Chiang, Hsinchu County (TW); Guan-Lin Chen, Hsinchu County (TW); Jung-Chien Cheng, Tainan City (TW); Shi-Ning Ju, Hsinchu City (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 703 days.

(21) Appl. No.: 18/299,199

(22) Filed: Apr. 12, 2023

(65) Prior Publication Data

US 2024/0347591 A1 Oct. 17, 2024

(51) Int. Cl.
*H10D 62/10* (2025.01)
*H10D 30/67* (2025.01)
*H10D 64/01* (2025.01)

(52) U.S. Cl.
CPC ....... *H10D 62/118* (2025.01); *H10D 30/6735* (2025.01); *H10D 30/6757* (2025.01); *H10D 62/121* (2025.01); *H10D 64/017* (2025.01)

(58) Field of Classification Search
CPC ........... H10D 30/6735; H10D 30/6757; H10D 62/118; H10D 62/121; H10D 64/017
See application file for complete search history.

(56) References Cited

U.S. PATENT DOCUMENTS

| | | | | |
|---|---|---|---|---|
| 9,209,247 | B2 | 12/2015 | Colinge et al. | |
| 9,236,267 | B2 | 1/2016 | De et al. | |
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 12,107,006 | B2 * | 10/2024 | You | H10D 30/6757 |
| 12,557,354 | B2 * | 2/2026 | Xie | H10D 30/031 |
| 2022/0173097 | A1 * | 6/2022 | Yang | H10D 30/014 |
| 2024/0258415 | A1 * | 8/2024 | Chiang | H10D 30/6735 |

* cited by examiner

*Primary Examiner* — William B Partridge
*Assistant Examiner* — Heim Kirin Grewal
(74) *Attorney, Agent, or Firm* — McClure, Qualey & Rodack, LLP

(57) ABSTRACT

Semiconductor structures and methods for forming the same are provided. The semiconductor structure includes first nanostructures formed over a substrate, and a first gate electrode layer formed on the first nanostructures. The semiconductor structure includes a second gate electrode layer adjacent to the first gate electrode layer, and a protective layer formed over the first gate electrode layer and the second gate electrode layer. The semiconductor structure includes a first dielectric structure between the first gate electrode layer and the second gate electrode layer, and the first dielectric structure penetrates through the protective layer.

20 Claims, 29 Drawing Sheets

GATE ALL AROUND SEMICONDUCTOR STRUCTURE WITH DIELECTRIC STRUCTURES OF DIFFERENT WIDTHS AND METHOD FOR FORMING THE SAME

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
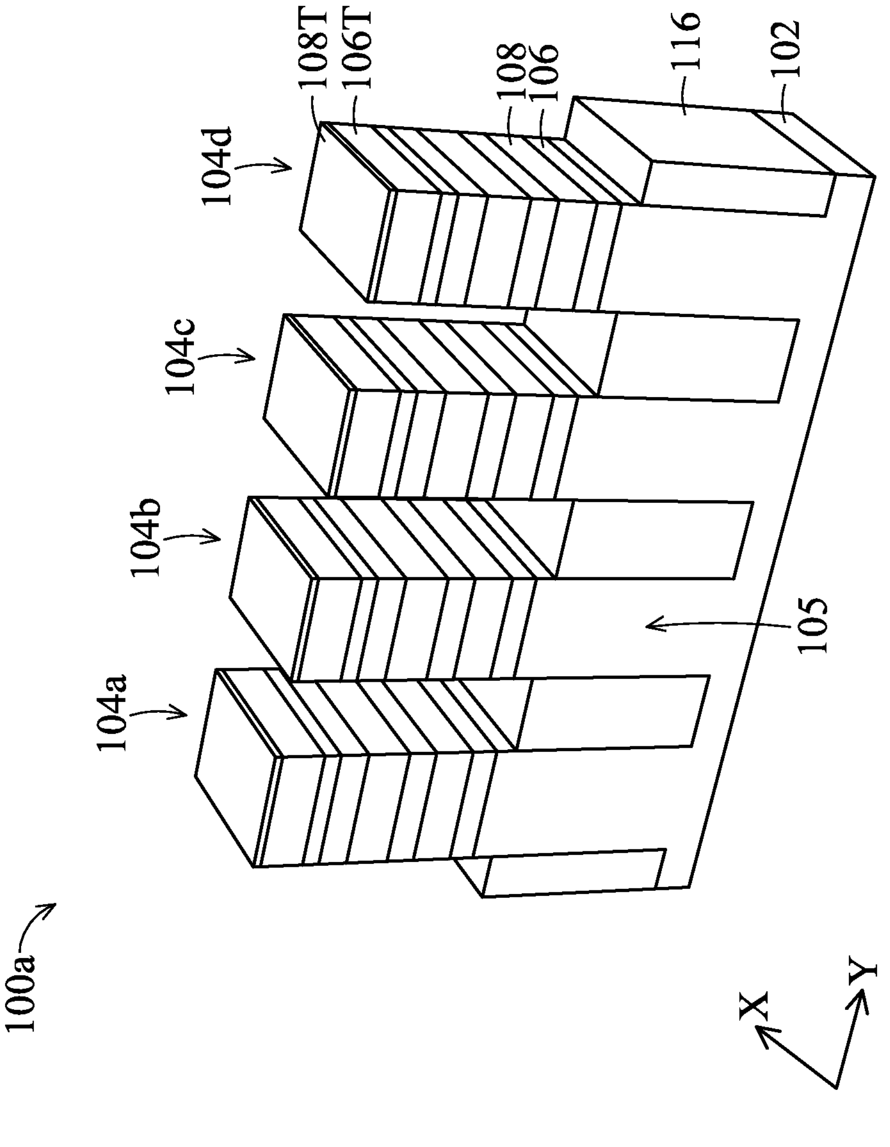
FIGS. 1A to 1X show perspective views of intermediate stages of forming a semiconductor structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fins described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of semiconductor structures and methods for forming the same are provided. The semiconductor structure includes nanostructures structure formed over a substrate. A first gate electrode layer is formed to wrap around the nanostructures, and a second gate electrode layer is formed adjacent to the first gate electrode layer. An S/D structure is formed on two sidewalls of the first gate structure. A protective layer is formed on the first gate electrode layer and the second gate electrode layer. A dielectric structure is formed between the first gate electrode layer and a second gate electrode layer. The dielectric structure passes through the protective layer. By forming the dielectric structure, the distance between the first gate electrode layer and the dielectric structure is reduced, and the distance between two adjacent nanostructures is reduced. Therefore, the unwanted capacitor is reduced. Accordingly, the performance of the semiconductor structure is improved. The source/drain (S/D) structure or S/D region(s) may refer to a source or a drain, individually or collectively dependent upon the context.

Figure 1B:
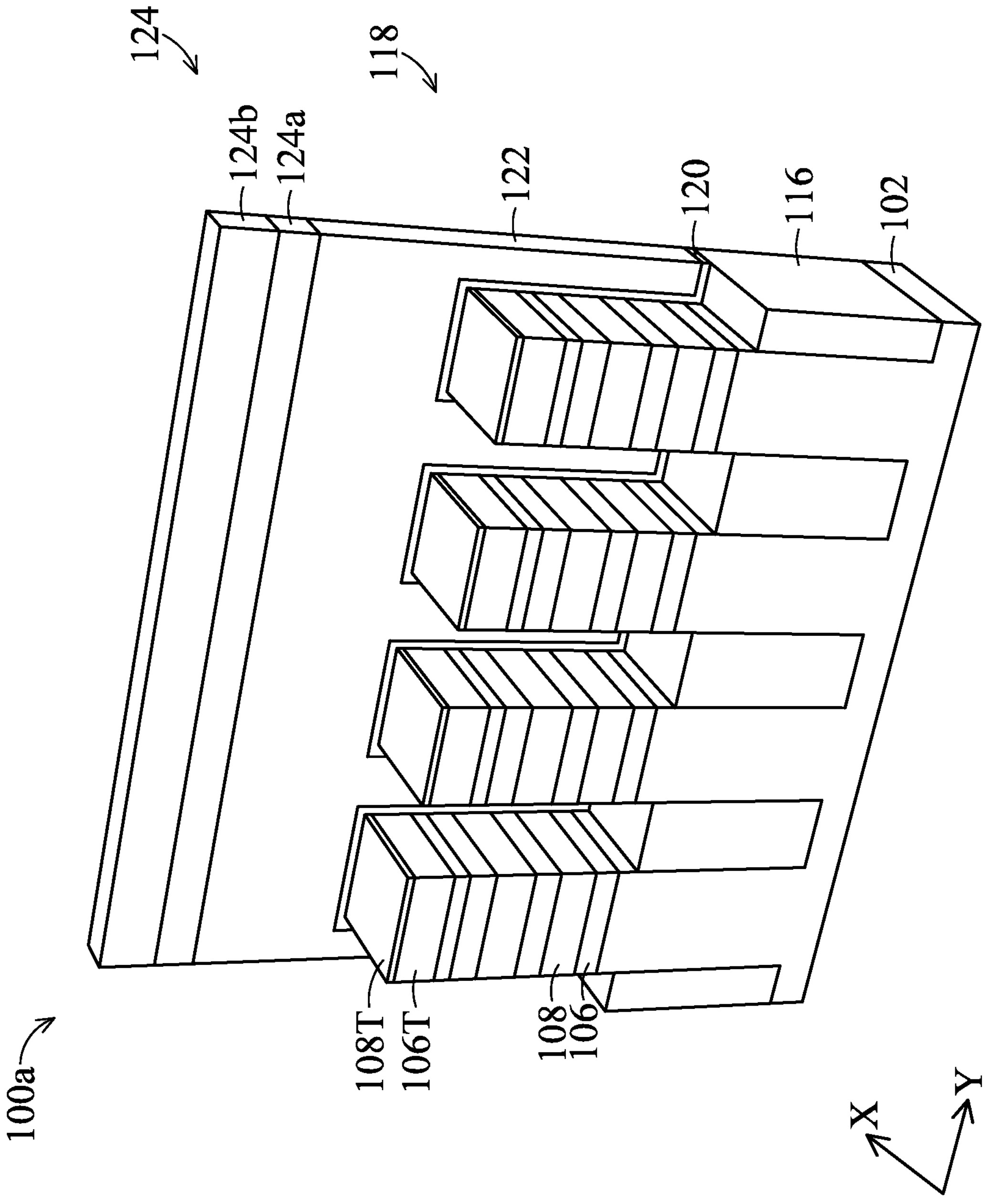
Figure 1C:
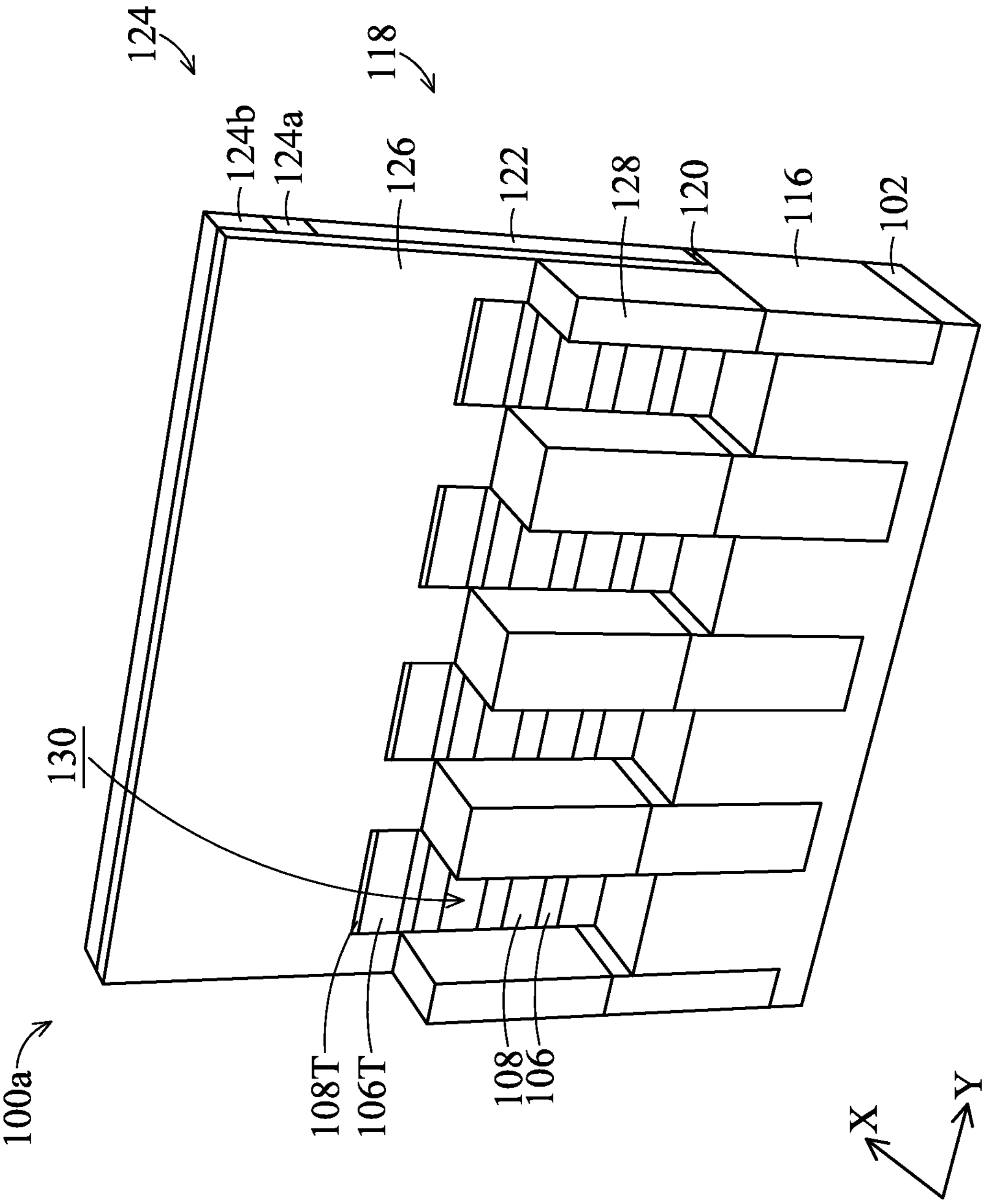
Figure 1D:
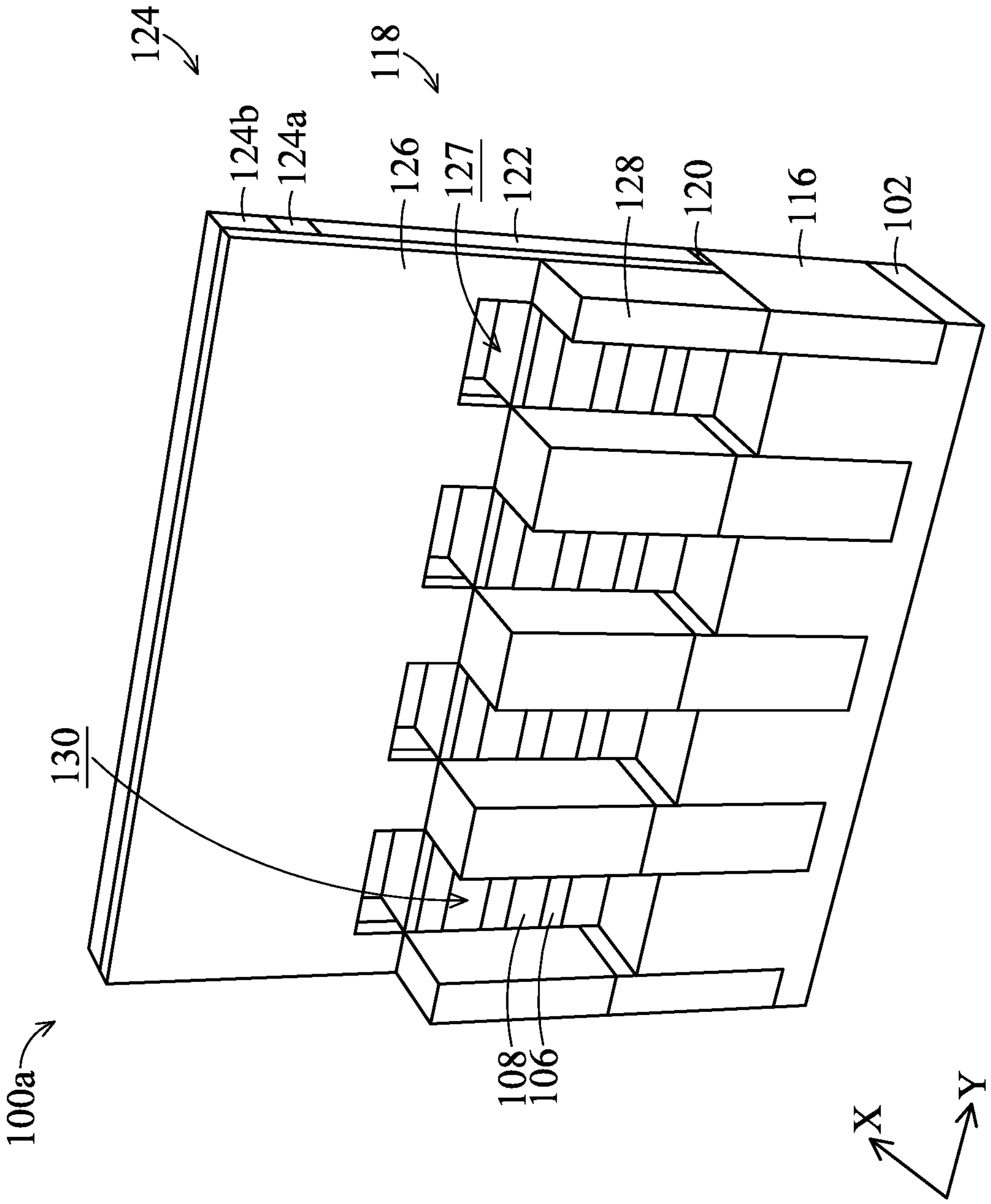
Figure 1E:
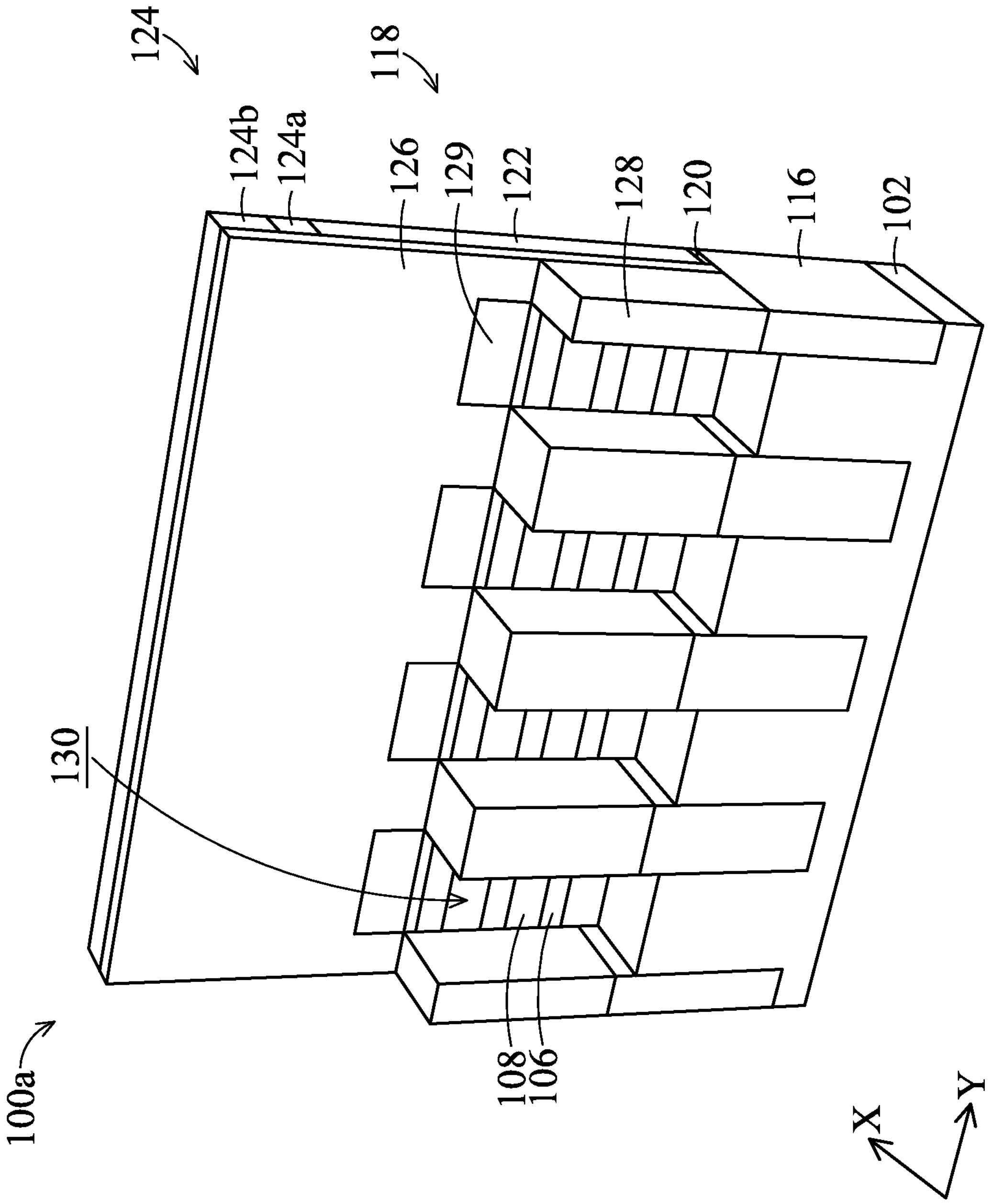
Figure 1F:
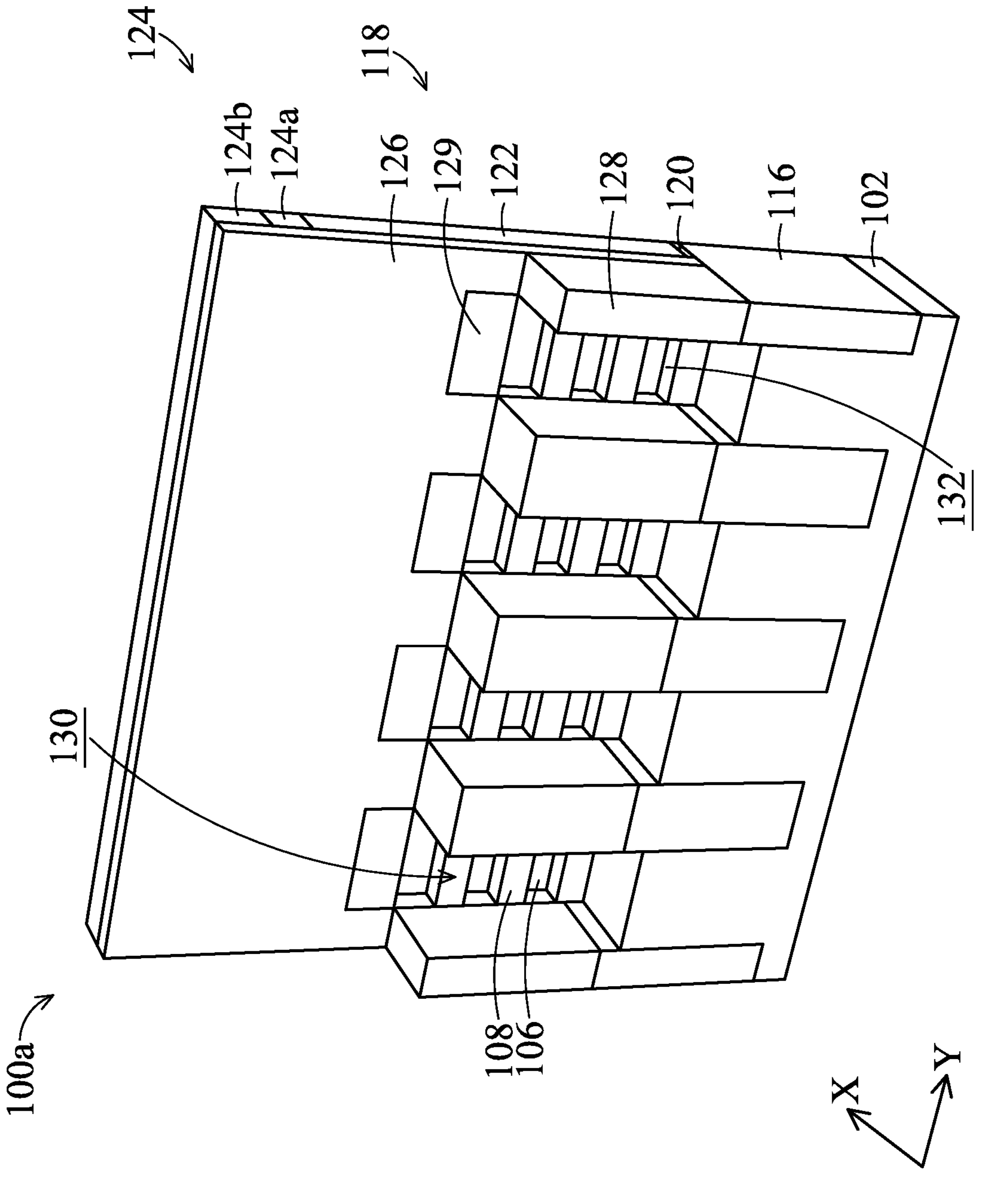
Figure 1G:
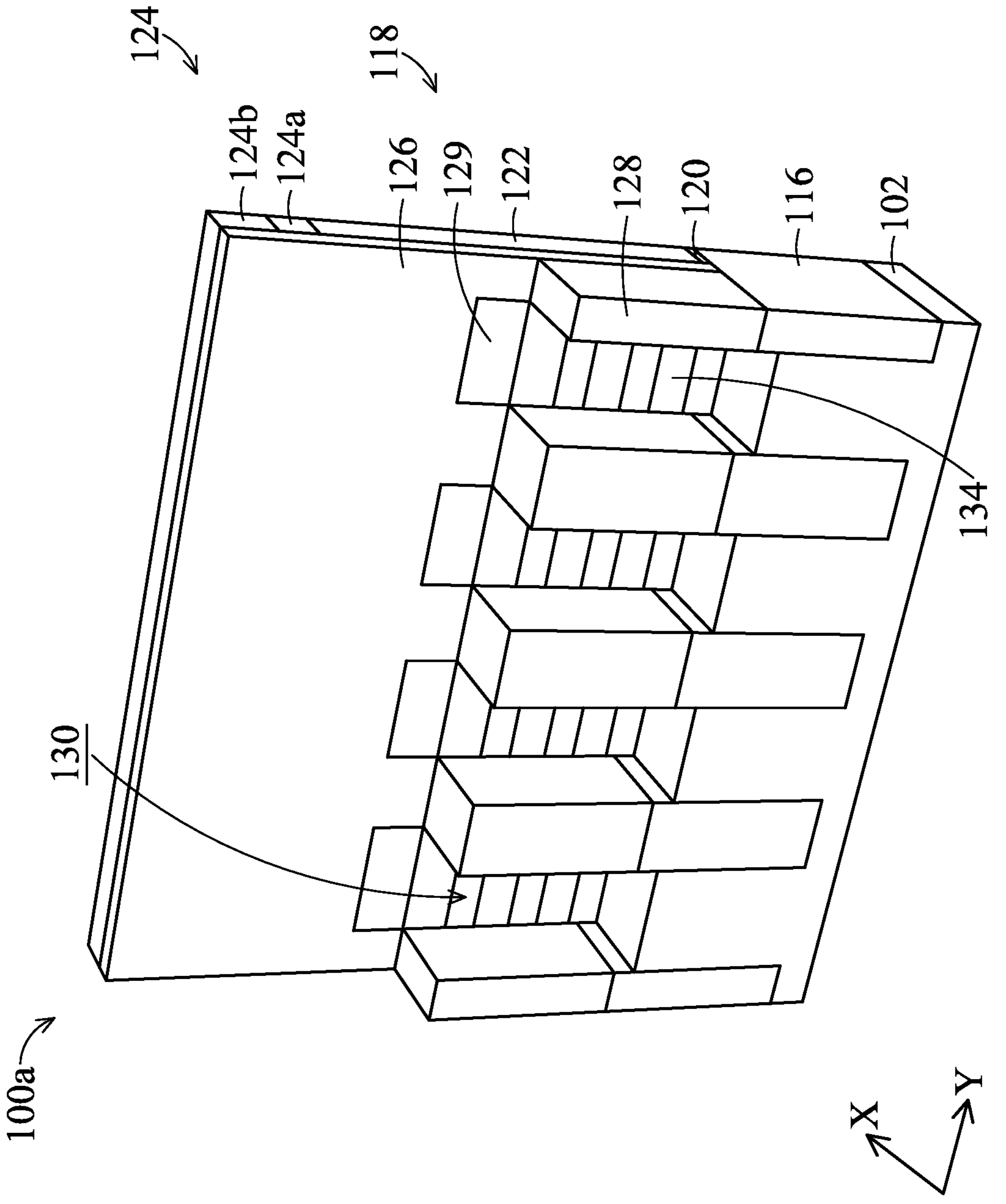
Figure 1H:
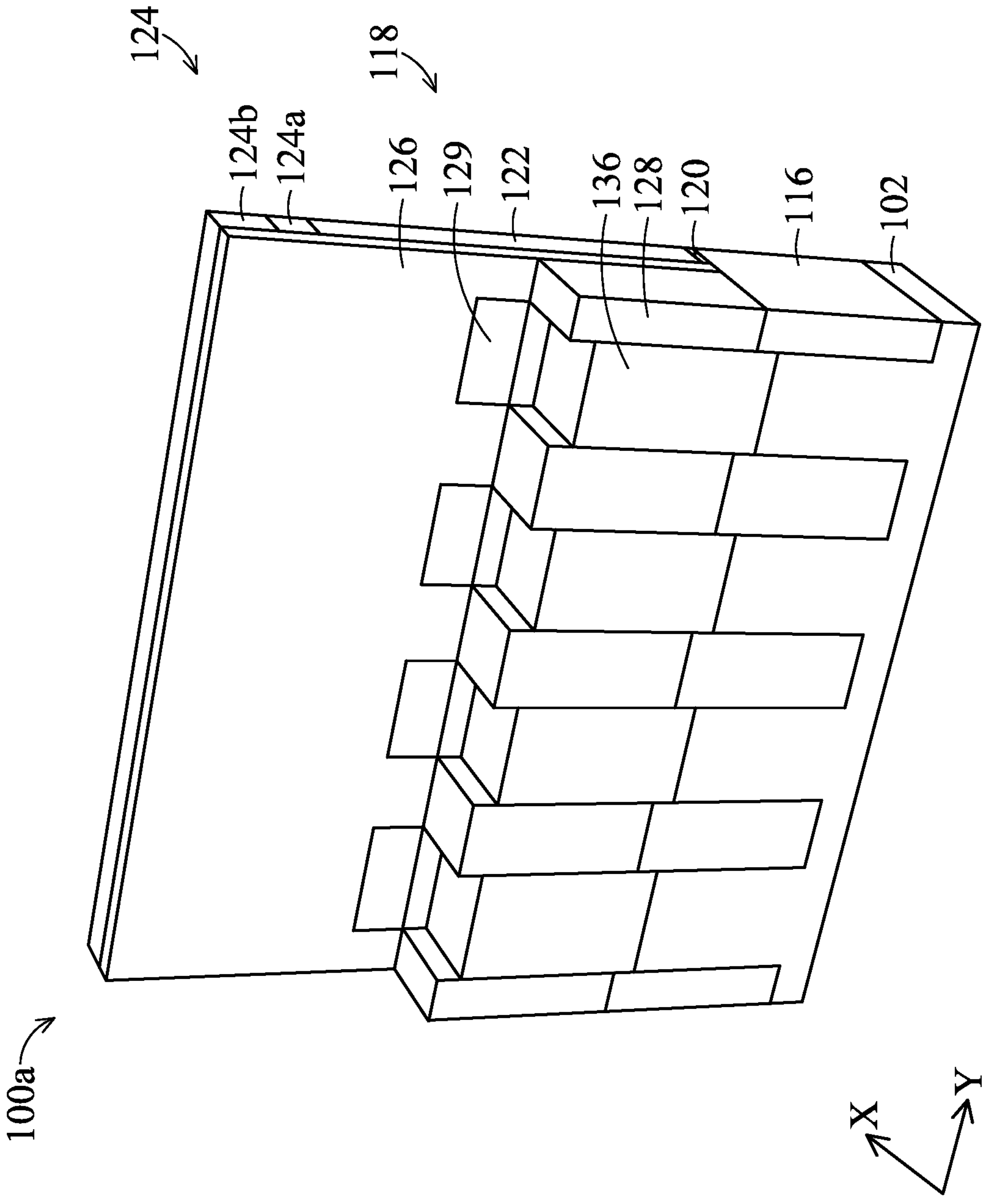
Figure 1I:
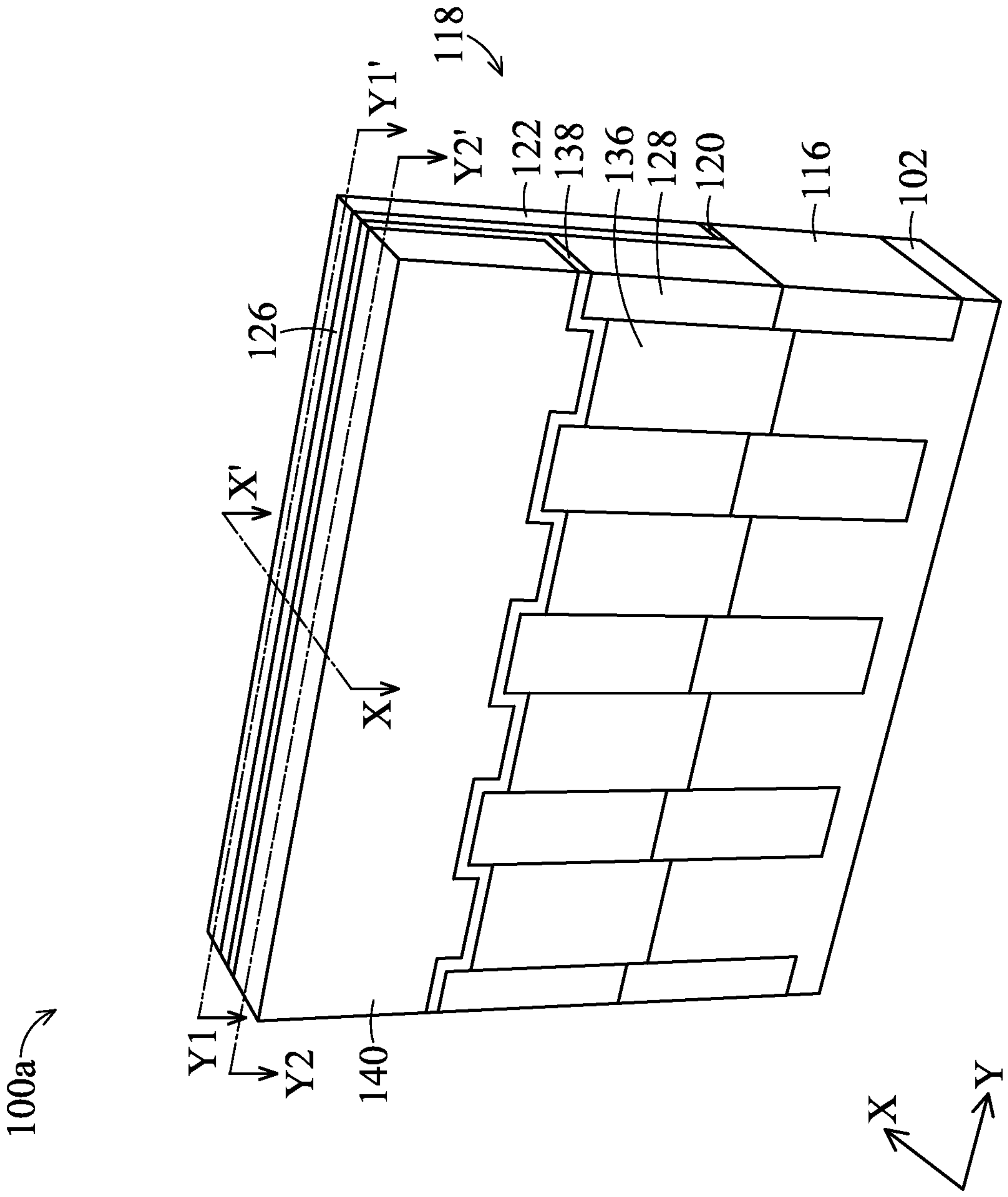
Figure 1J:
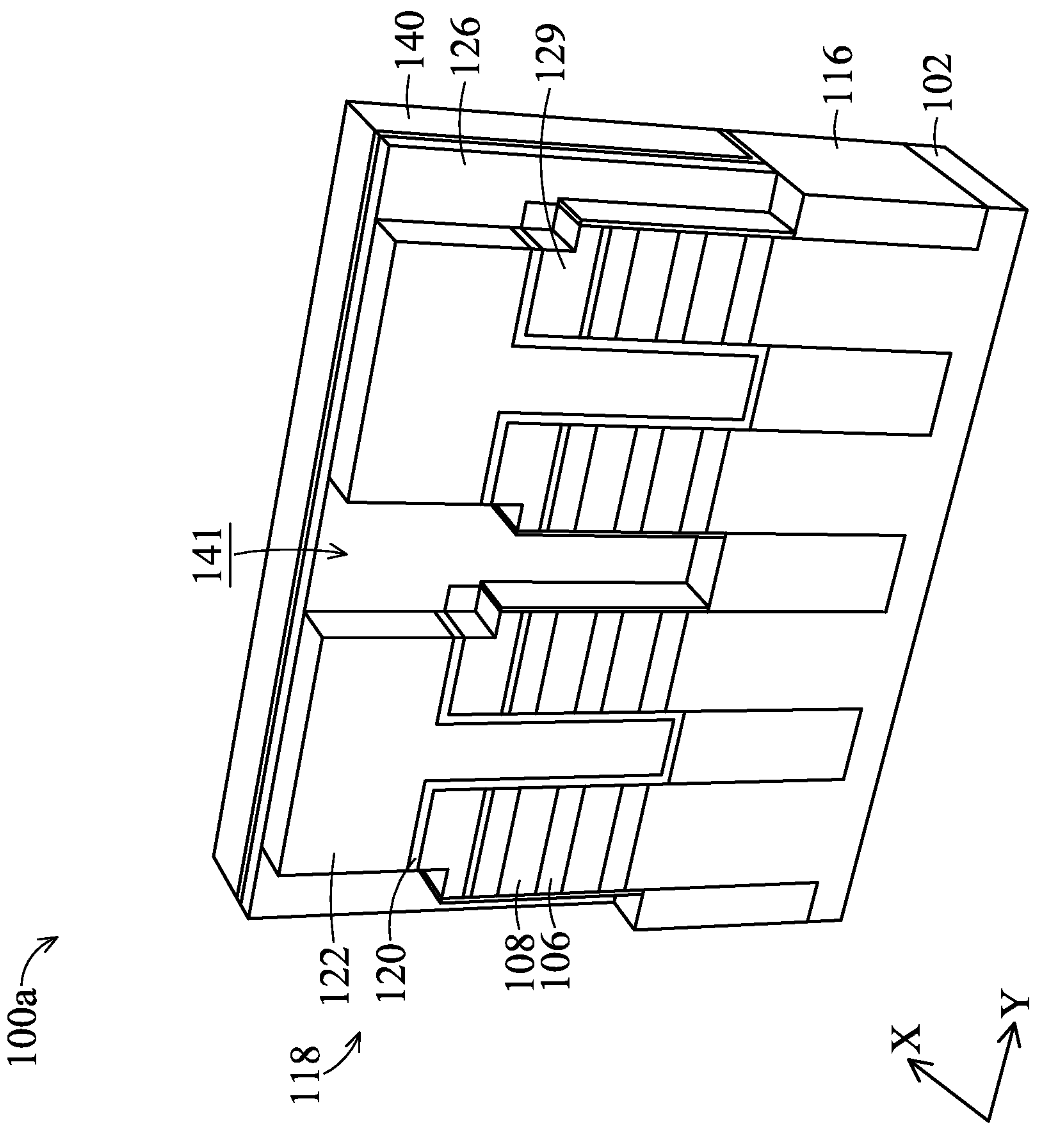
Figure 1K:
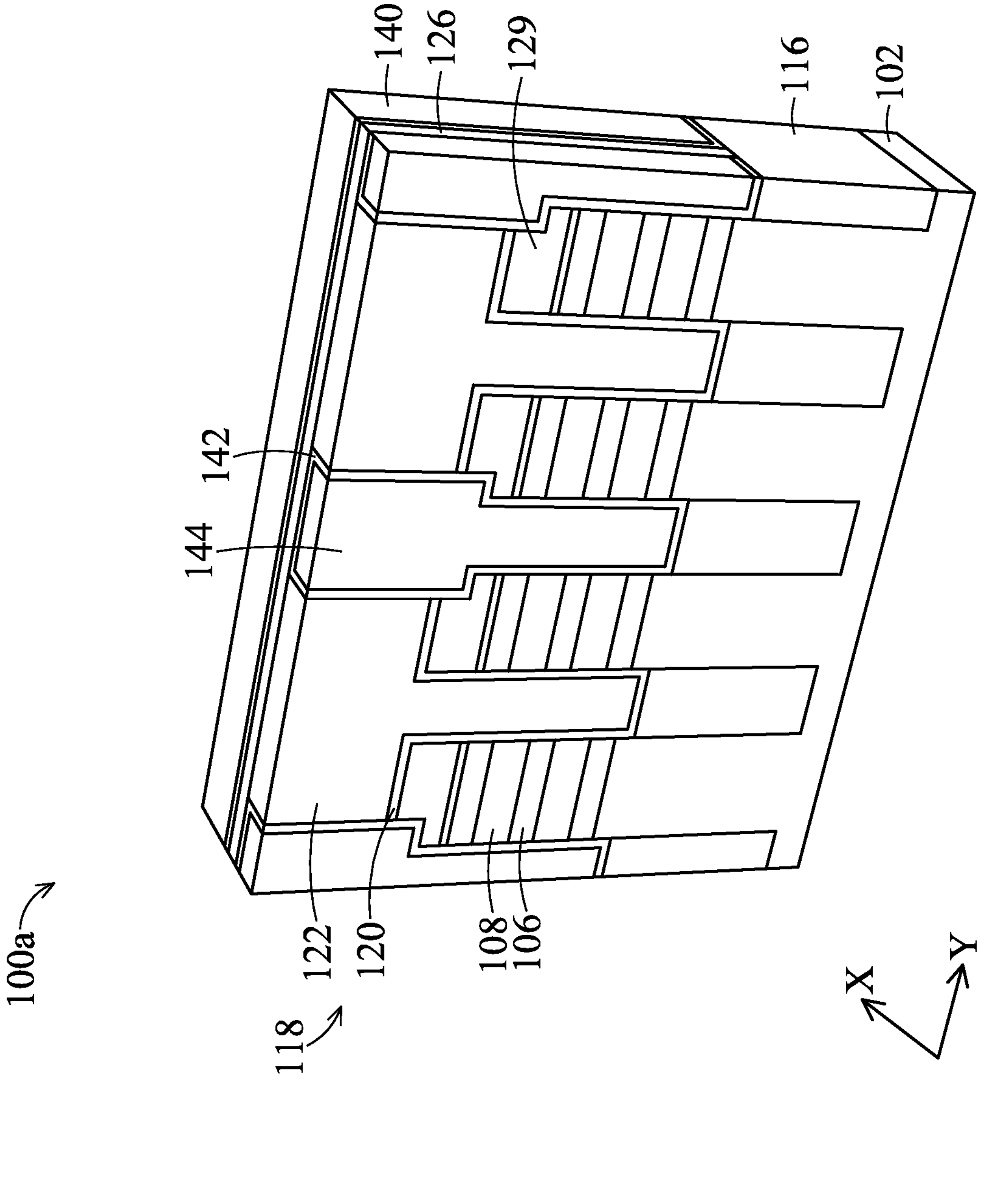
Figure 1L:
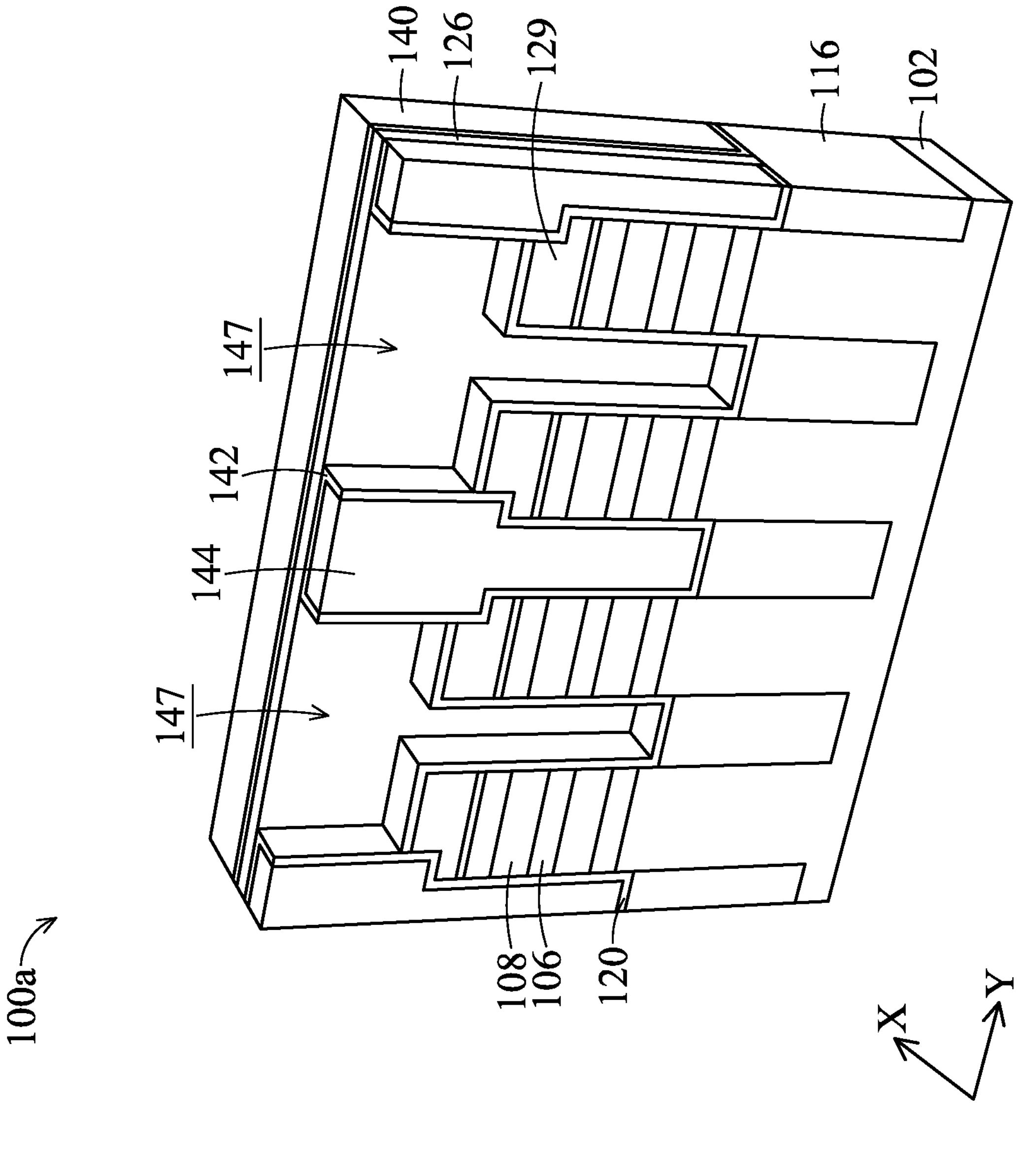
Figure 1M:
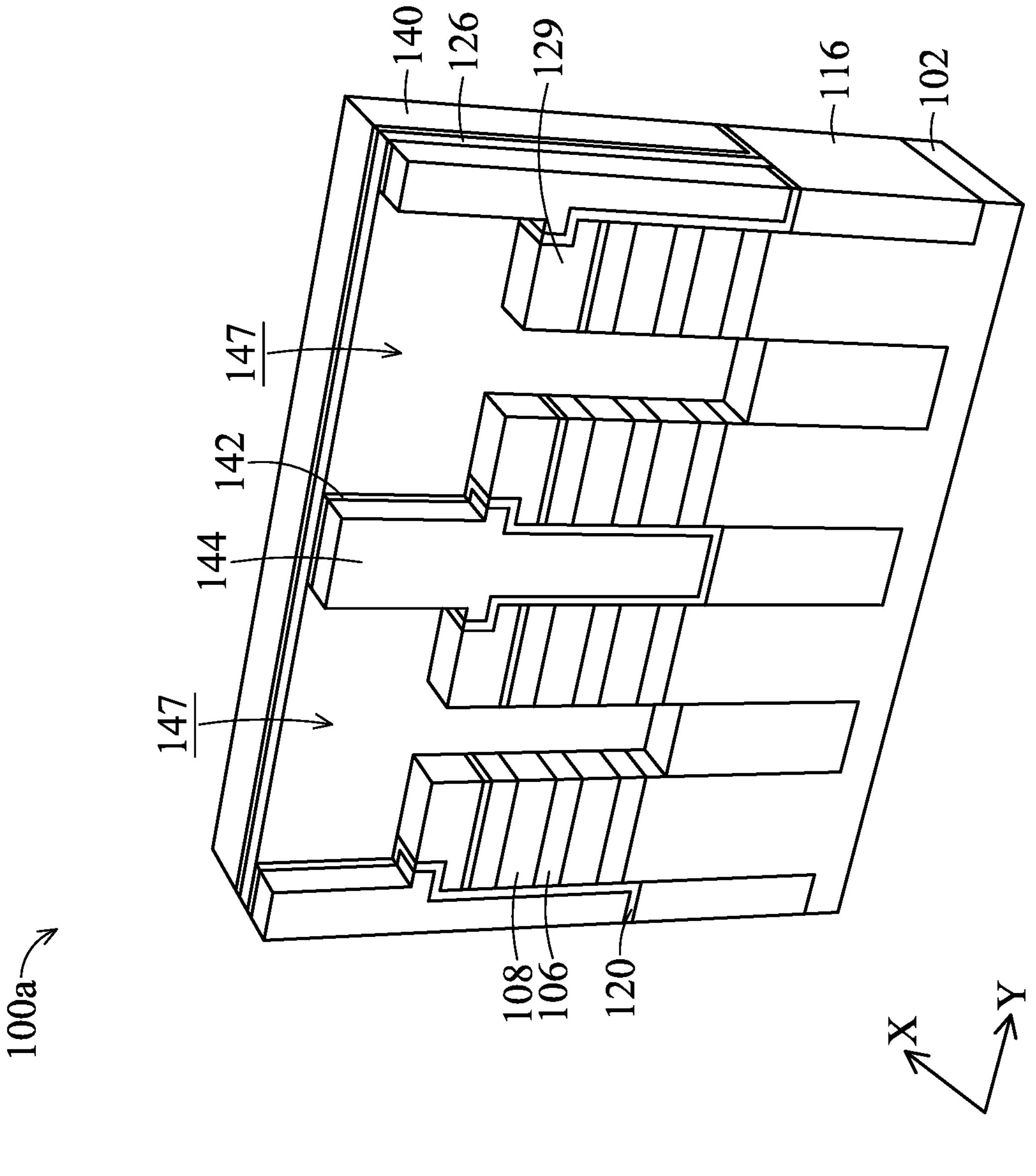
Figure 1N:
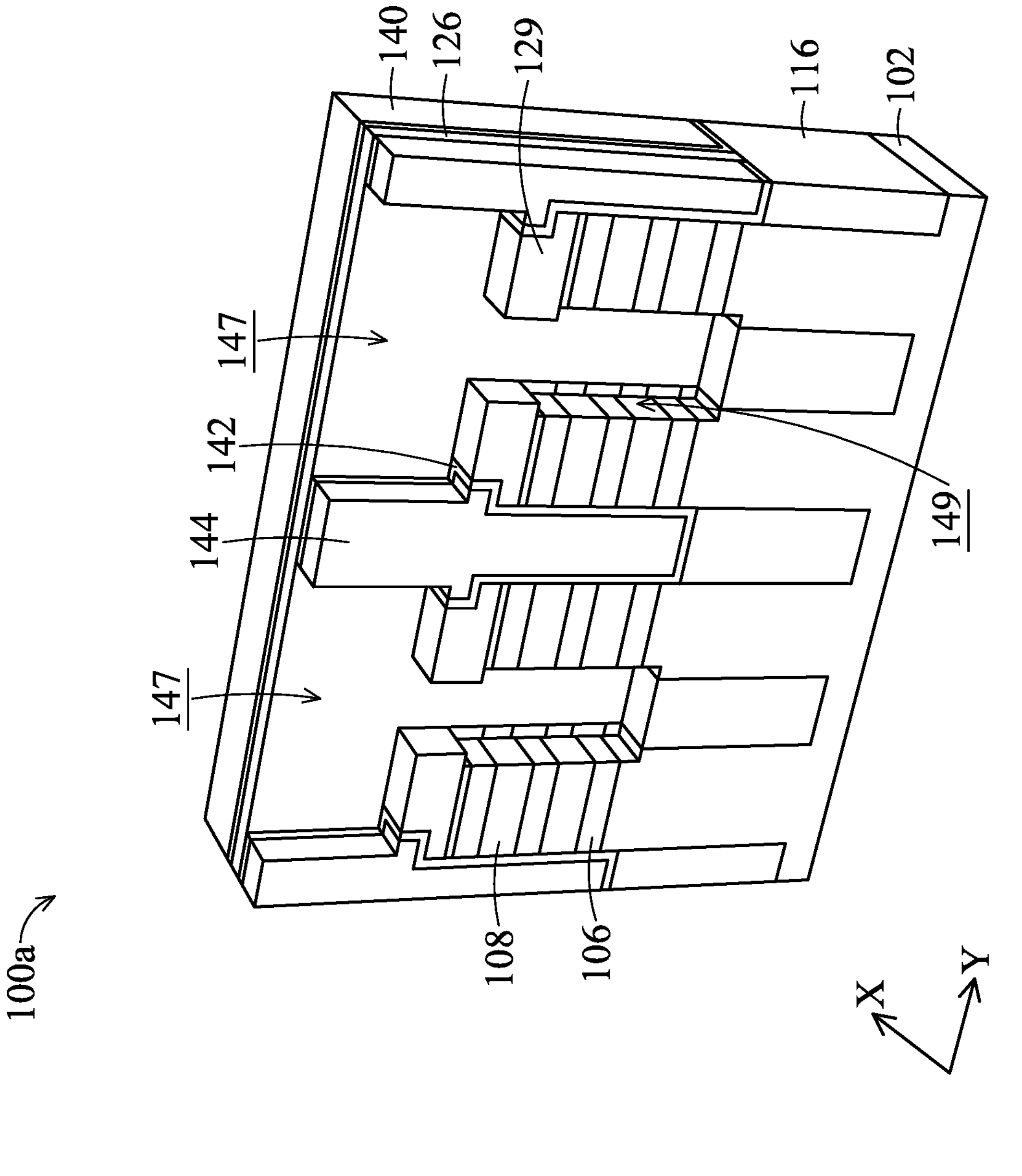
Figure 1O:
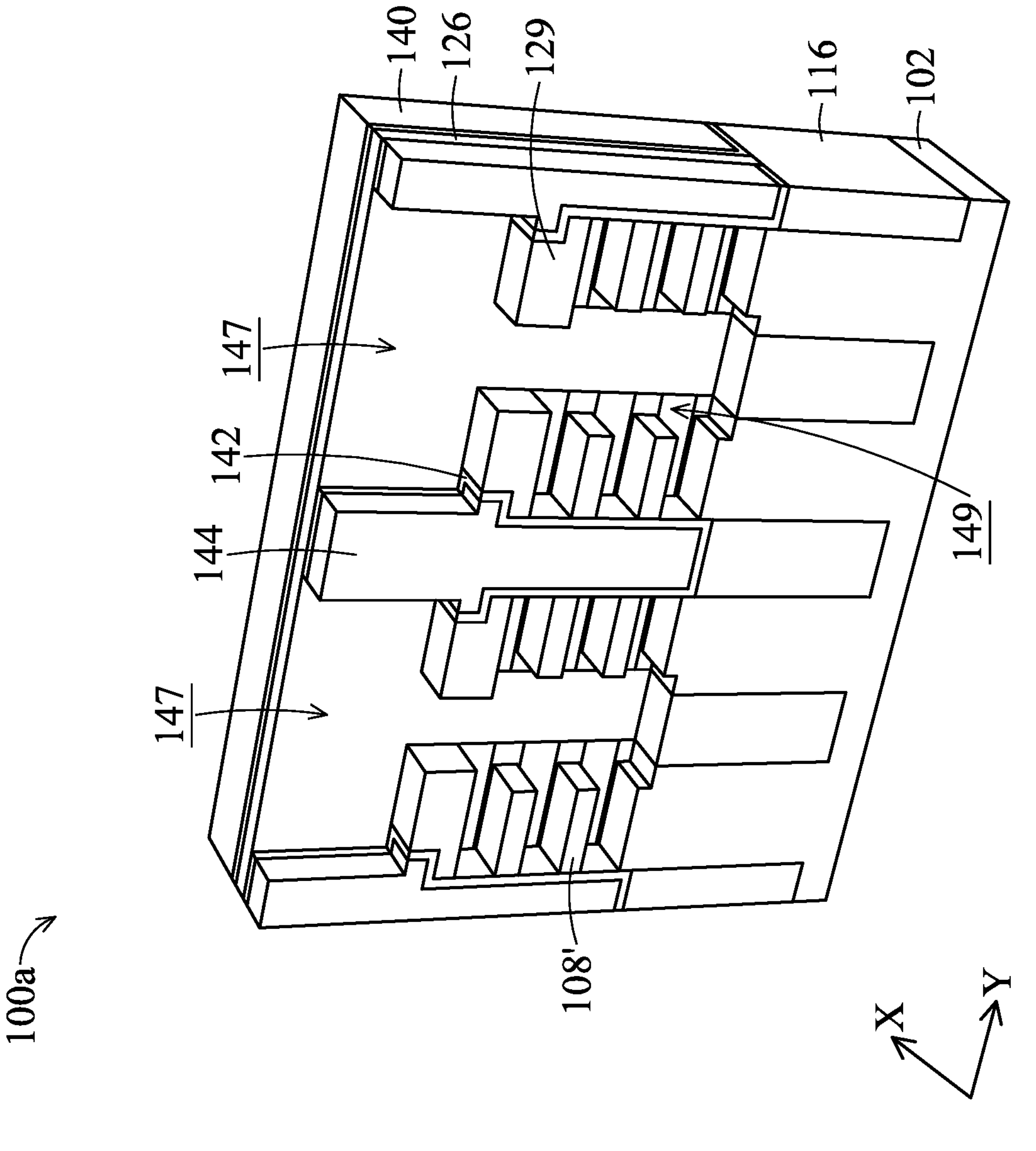
Figure 1P:
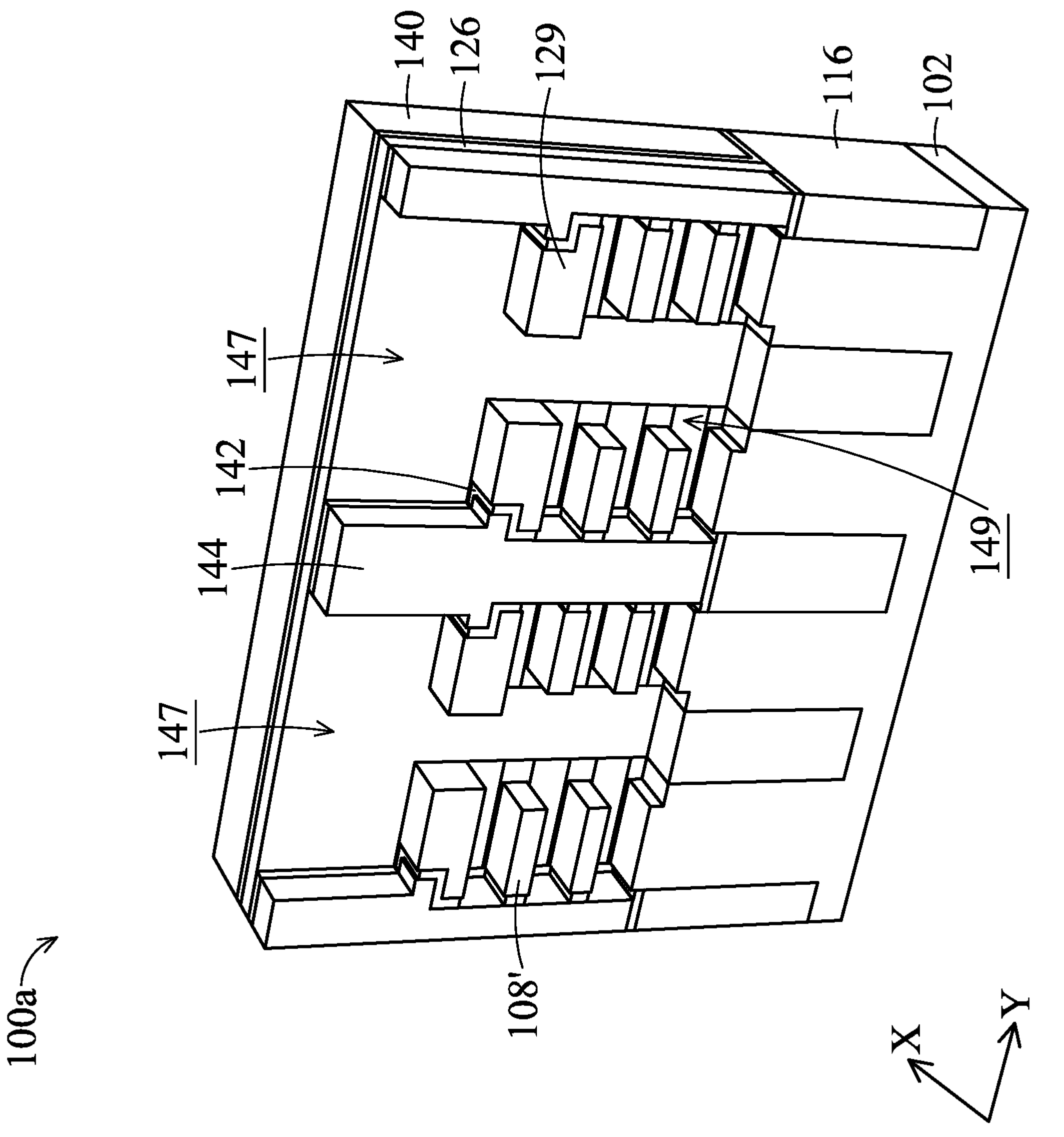
Figure 1Q:
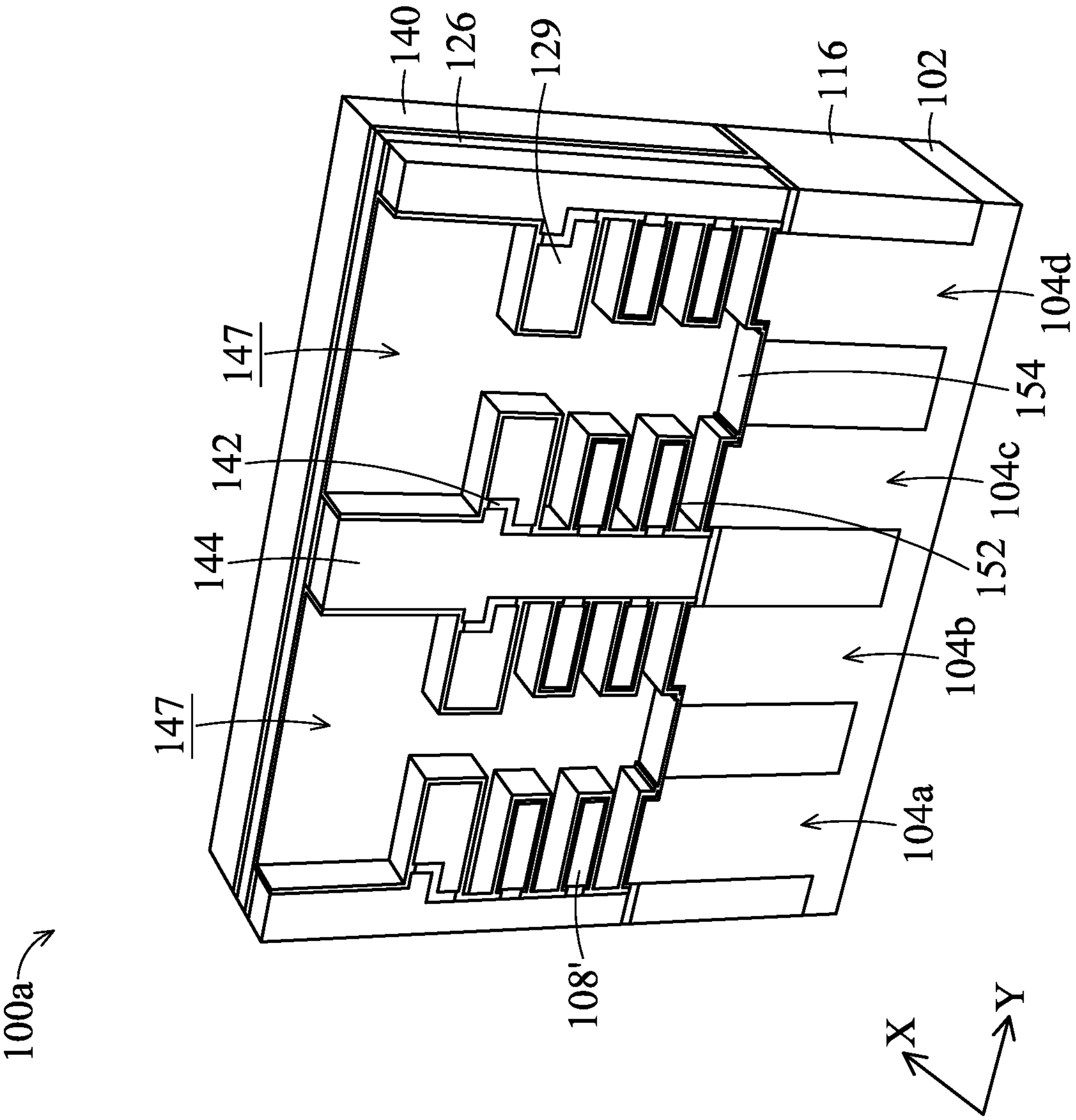
Figure 1R:
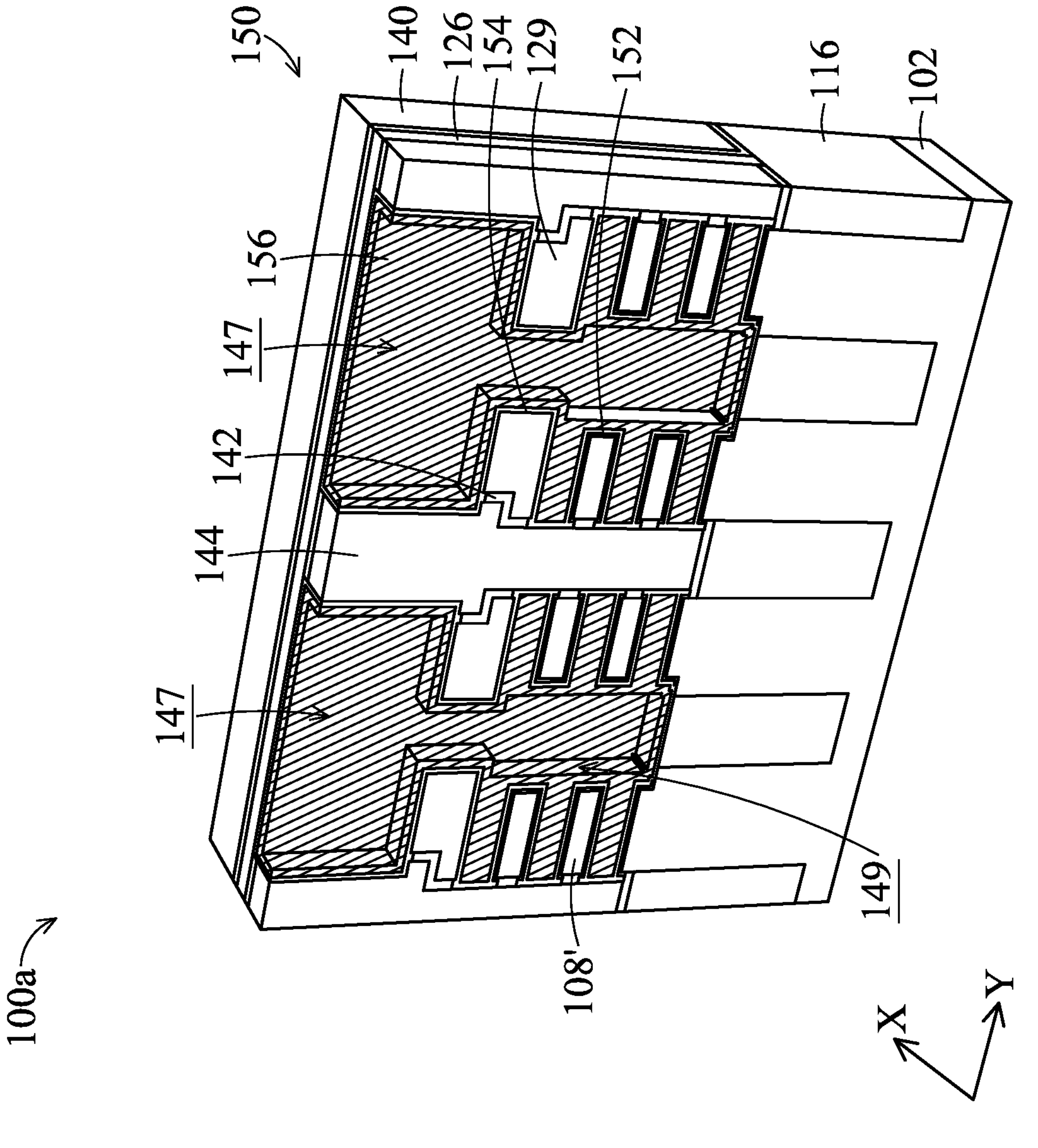
Figure 1S:
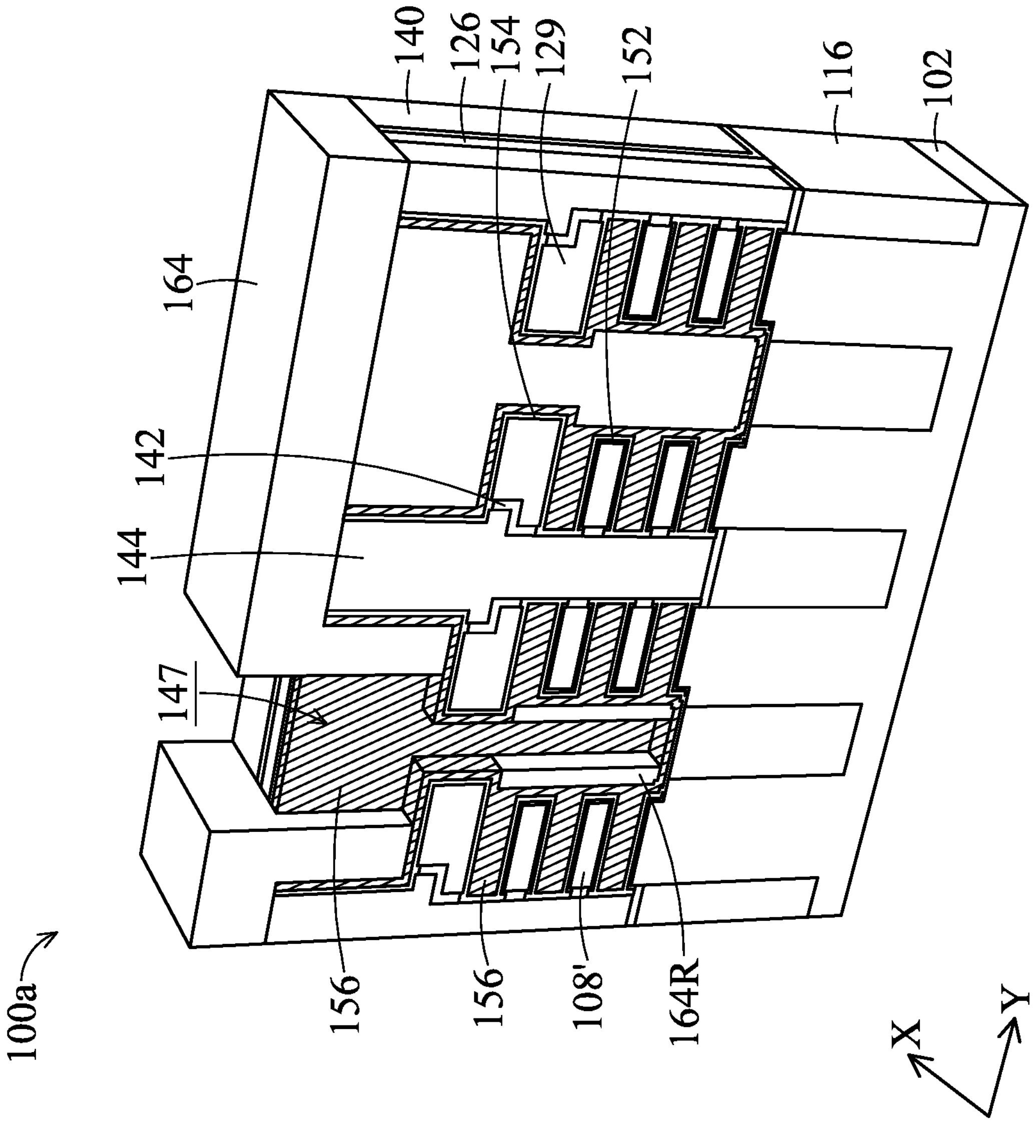
Figure 1T:
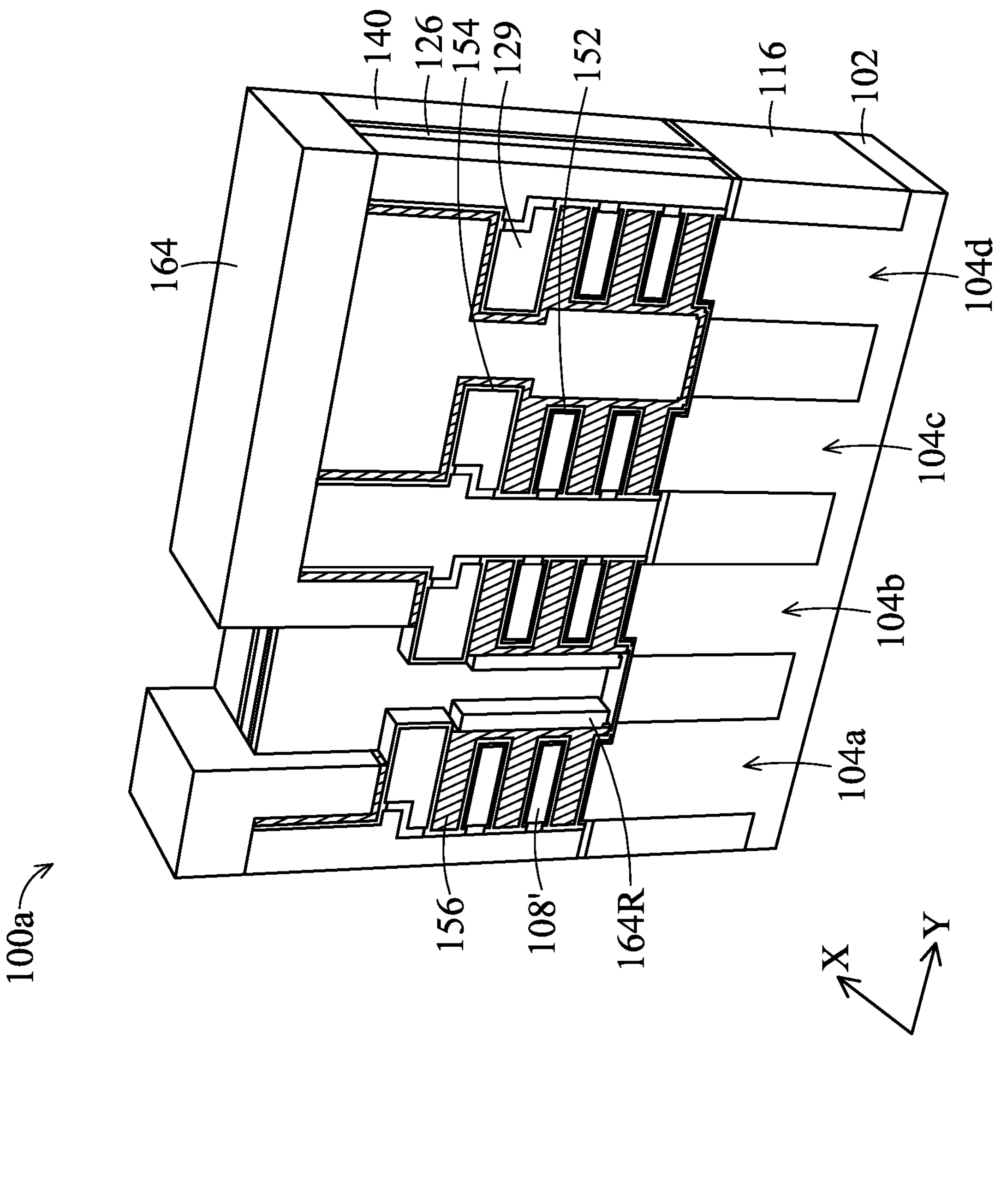
Figure 1U:
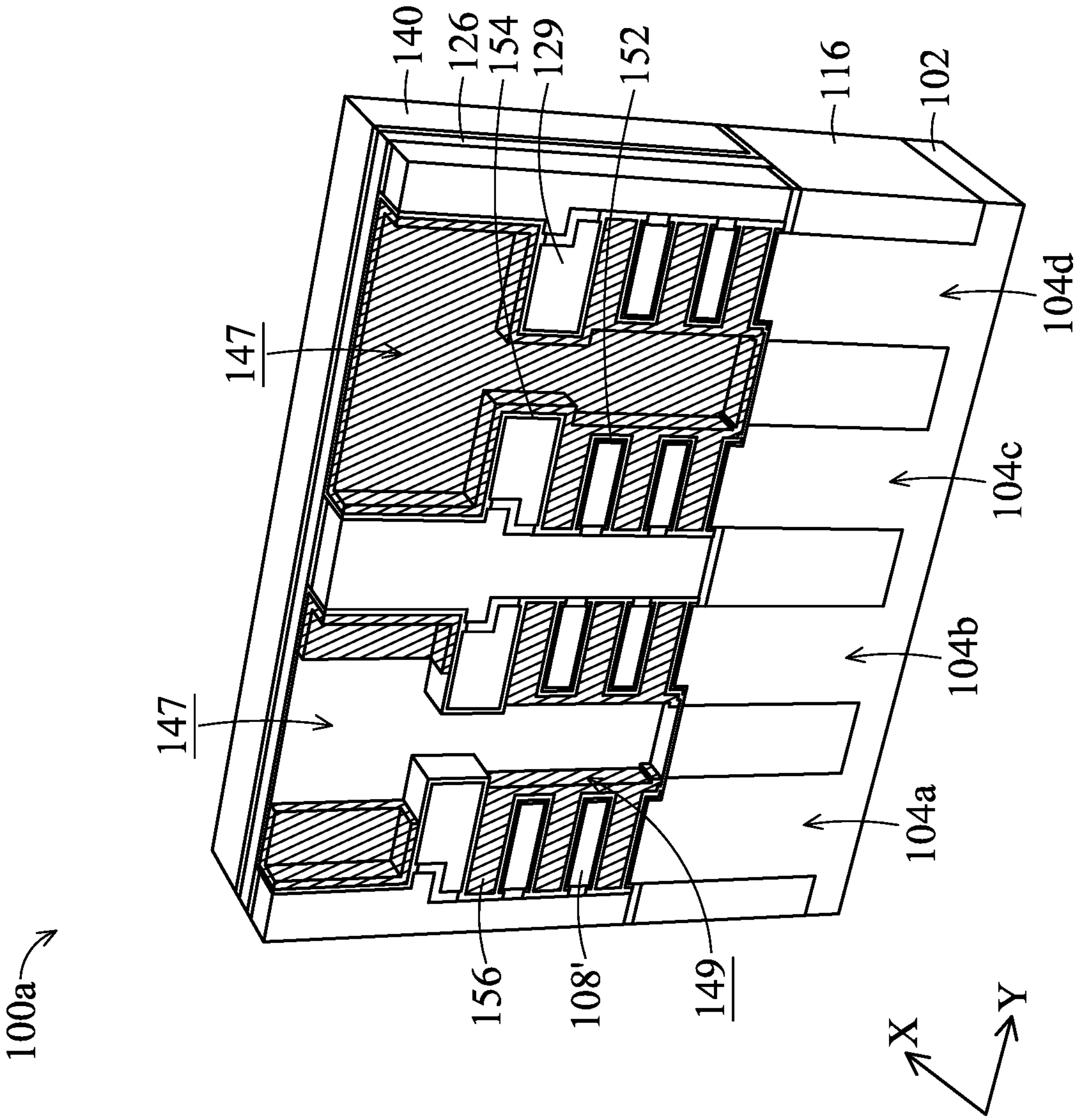
Figure 1V:
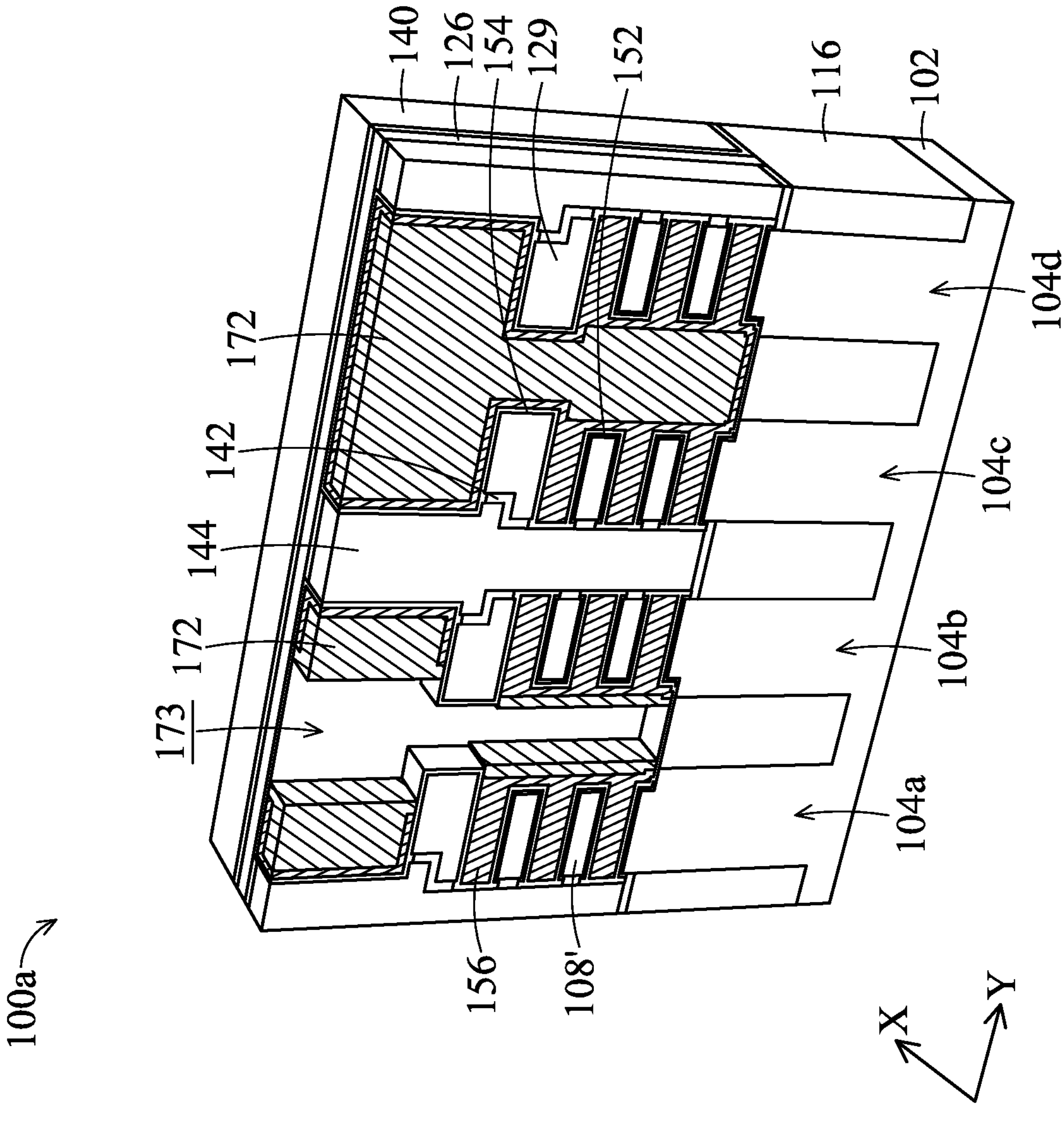
Figure 1W:
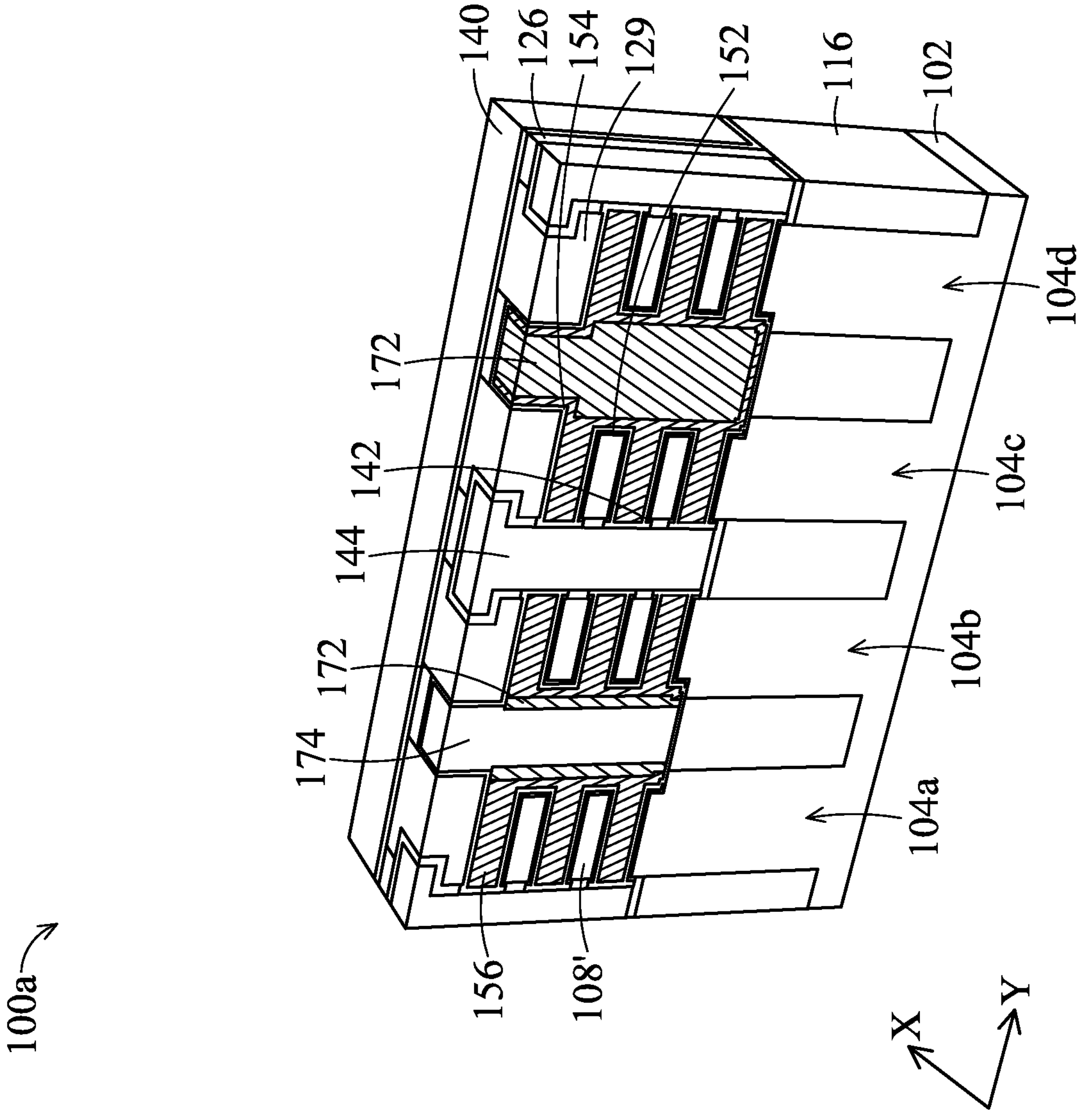
Figure 1X:
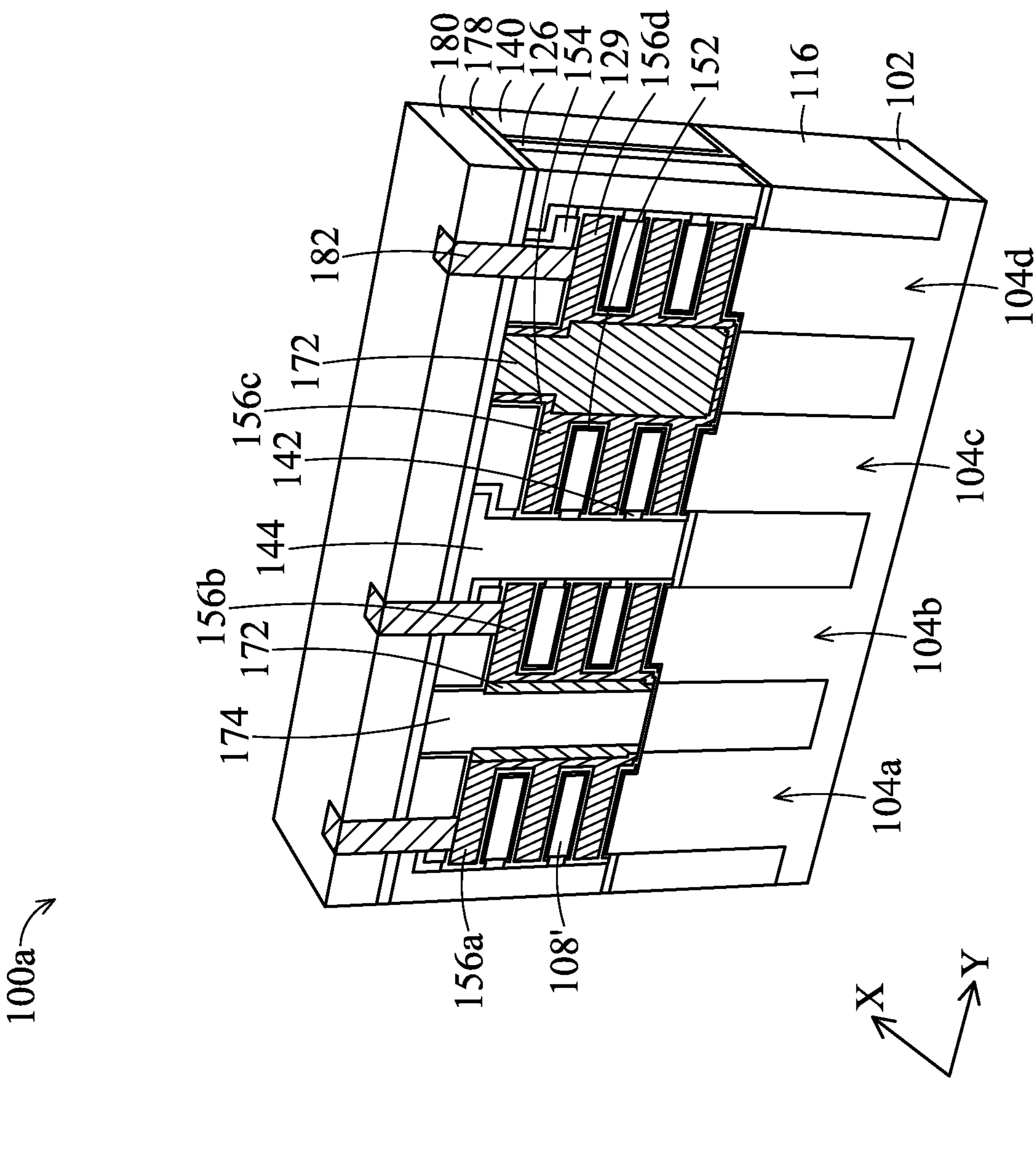

FIGS. 1A to 1X show perspective views of intermediate stages of forming a semiconductor structure 100*a* in accordance with some embodiments. As shown in FIG. 1A, first semiconductor material layers 106 and second semiconductor material layers 108, the topmost first semiconductor material layer 106T and the topmost second semiconductor material layer 108 are formed over a substrate 102 along the x-axis.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, a stack of alternating first semiconductor material layers 106 and second semiconductor material layers 108 is stacked over the substrate 102. In some embodiments, the first semiconductor material layers 106 and the second semiconductor material layers 108 are made of different semiconductor materials.

In some embodiments, the first semiconductor layers 106 and the second semiconductor layers 108 independently include silicon (Si), germanium (Ge), silicon germanium (SiGe), indium arsenide (InAs), indium gallium arsenide (InGaAs), indium antimonide (InSb), or another applicable material.

The first semiconductor layers 106 and the second semiconductor layers 108 are made of different materials having different lattice constant. In some embodiments, the first semiconductor layer 106 is made of silicon (Si), and the second semiconductor layer 108 is made of silicon germanium (SiGe).

In some embodiments, the first semiconductor layer 106 is made of silicon germanium (SiGe), and the second semiconductor layer 108 is made of silicon (Si). In some embodiments, the germanium concentration of the topmost first semiconductor layer 106 is higher than the other first semiconductor layers 106. In some embodiments, the germanium (Ge) concentration of the topmost first semiconductor layer 106T is in a range from about 30% to about 50%. In some embodiments, the germanium (Ge) concentration of the other first semiconductor layers 106 is in a range from about 15% to about 30%.

It should be noted that although three first semiconductor material layers 106 and three second semiconductor material layers 108 are formed, the semiconductor structure may include more or fewer first semiconductor material layers 106 and second semiconductor material layers 108. For example, the semiconductor structure may include two to five of the first semiconductor material layers 106 and the second semiconductor material layers.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Afterwards, after the first semiconductor material layers 106 and the second semiconductor material layers 108 are formed as a semiconductor material stack over the substrate 102, the semiconductor material stack is patterned to form fin structures **104*a*/104*b*/104*c*/104*d*, in accordance with some embodiments. In some embodiments, the fin structures 104*a*/104*b*/104*c*/104*d* include a base fin structure 105 and the semiconductor material stack of the first semiconductor material layers 106 and the second semiconductor material layers 108**.

In some embodiments, the patterning process includes forming a mask structure (not shown) over the semiconductor material stack, and etching the semiconductor material stack and the underlying substrate 102 through the mask structure 110. In some embodiments, the mask structure is a multilayer structure including a pad oxide layer and a nitride layer formed over the pad oxide layer. The pad oxide layer may be made of silicon oxide, which is formed by thermal oxidation or chemical vapor deposition (CVD), and the nitride layer may be made of silicon nitride, which is formed by chemical vapor deposition (CVD), such as low-temperature chemical vapor deposition (LPCVD) or plasma-enhanced CVD (PECVD).

Afterwards, after the fin structures **104*a*/104*b*/104*c*/104*d* are formed, an isolation structure 116 is formed around the fin structures 104*a*/104*b*/104*c*/104*d*, and the mask structure is removed, in accordance with some embodiments. The isolation structure 116 is configured to electrically isolate active regions (e.g. the fin structures 104*a*/104*b*/104*c*/104*d*) of the semiconductor structure 100** and is also referred to as shallow trench isolation (STI) feature in accordance with some embodiments.

The isolation structure 116 may be formed by depositing an insulating layer over the substrate 102 and recessing the insulating layer so that the fin structures **104*a*/104*b*/104*c*/104*d* is protruded from the isolation structure 116. In some embodiments, the isolation structure 116 is made of silicon oxide, silicon nitride, silicon oxynitride (SiON), another suitable insulating material, or a combination thereof. In some embodiments, a dielectric liner (not shown) is formed before the isolation structure 116** is formed, and the dielectric liner is made of silicon nitride and the isolation structure formed over the dielectric liner is made of silicon oxide.

As shown in FIG. 1B, after the isolation structure 116 is formed, dummy gate structure 118 is formed across the fin structures **104*a*/104*b*/104*c*/104*d* and extend over the isolation structure 116, in accordance with some embodiments. The dummy gate structure 118 may be used to define the source/drain (S/D) regions and the channel regions of the resulting semiconductor structure 100*a*. The dummy gate structure 118** is formed along the Y-axis.

In some embodiments, the dummy gate structure 118 includes a dummy gate dielectric layer 120 and a dummy gate electrode layer 122. In some embodiments, the dummy gate dielectric layer 120 is made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layer 120 is formed using thermal oxidation, chemical vapor deposition (CVD), atomic layer deposition (ALD), physical vapor deposition (PVD), another suitable method, or a combination thereof.

In some embodiments, the dummy gate electrode layer 122 includes polycrystalline-silicon (poly-Si), poly-crystalline silicon-germanium (poly-SiGe), metallic nitrides, metallic silicides, metals, or a combination thereof. In some embodiments, the dummy gate electrode layer 122 is formed using chemical vapor deposition (CVD), physical vapor deposition (PVD), or a combination thereof.

In some embodiments, the hard mask layers 124 are formed over the dummy gate structure 118. In some embodiments, the hard mask layers 124 include multiple layers, such as an oxide layer 124*a* and a nitride layer 124*b*. In some embodiments, the oxide layer is silicon oxide, and the nitride layer is silicon nitride.

The formation of the dummy gate structure 118 may include conformally forming a dielectric material as the dummy gate dielectric layers 120. Afterwards, a conductive material may be formed over the dielectric material as the dummy gate electrode layers 122, and the hard mask layer 124 may be formed over the conductive material. Next, the dielectric material and the conductive material may be patterned through the hard mask layer 124 to form the dummy gate structure 118.

As shown in FIG. 1C, after the dummy gate structure 118 is formed, gate spacer layer 126 are formed along and covering opposite sidewalls of the dummy gate structure 118 and fin spacer layers 128 are formed along and covering opposite sidewalls of the source/drain regions of the fin structures 104*a*/104*b*/104*c*/104*d*, in accordance with some embodiments.

The gate spacer layers 126 may be configured to separate source/drain (S/D) structures from the dummy gate structure 118 and support the dummy gate structure 118, and the fin spacer layers 128 may be configured to constrain a lateral growth of subsequently formed source/drain structure and support the fin structures 104*a*/104*b*/104*c*/104*d*.

In some embodiments, the gate spacer layers 126 and the fin spacer layers 128 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. The formation of the gate spacer layers 126 and the fin spacer layers 128 may include conformally depositing a dielectric material covering the dummy gate structure 118, the fin structures 104*a*/104*b*/104*c*/104*d*, and the isolation structure 116 over the substrate 102, and performing an anisotropic etching process, such as dry plasma etching, to remove the dielectric layer covering the top surfaces of the dummy gate structure 118, the fin structures 104*a*/104*b*/104*c*/104*d*, and portions of the isolation structure 116.

After the gate spacer layers 126 and the fin spacer layers 128 are formed, the source/drain (S/D) regions of the fin structures 104*a*/104*b*/104*c*/104*d* are recessed to form source/drain (S/D) recesses 130, in accordance with some embodiments. More specifically, the first semiconductor material layers 106 and the second semiconductor material layers 108 not covered by the dummy gate structure 118 and the gate spacer layers 126 are removed in accordance with some embodiments.

In some embodiments, the fin structures 104*a*/104*b*/104*c*/104*d* are recessed by performing an etching process. The etching process may be an anisotropic etching process, such as dry plasma etching, and the dummy gate structure 118 and the gate spacer layers 126 are used as etching masks during the etching process. In some embodiments, the fin spacer layers 128 are also recessed to form lowered fin spacer layers 128.

Next, as shown in FIG. 1D, the topmost first semiconductor layer 106T and the topmost second semiconductor layer 108T are removed to form a recess 127, in accordance with some embodiments. The recess 127 is higher than the fin spacer layers 128.

Afterwards, as shown in FIG. 1E, a protective layer 129 is formed in the recess 127, in accordance with some embodiments. The protective layer 129 is configured to protect the layers underlying layers from being damaged in the subsequent processes. Furthermore, the protective layer 129 is configured to be an etching stop layer.

In some embodiments, the protective layer 129 is made of silicon nitride (SiN), silicon carbide (SiC), silicon oxynitride (SiON), silicon carbon nitride (SiCN), silicon oxide carbonitride (SiOCN), or a combination thereof. In some embodiments, the protective layer 129 is formed by a deposition process, such as chemical vapor deposition (CVD), atomic layer deposition (ALD), physical vapor deposition (PVD), another suitable method, or a combination thereof.

Next, as shown in FIG. 1F, after the protective layer 129 is formed, the first semiconductor material layers 106 exposed by the S/D recesses 130 are laterally recessed to form notches 132, in accordance with some embodiments.

In some embodiments, an etching process is performed on the semiconductor structure 100 to laterally recess the first semiconductor material layers 106 of the fin structures 104*a*/104*b*/104*c*/104*d* from the source/drain recesses 130. In some embodiments, during the etching process, the first semiconductor material layers 106 have a greater etching rate (or etching amount) than the second semiconductor material layers 108, thereby forming notches 132 between adjacent second semiconductor material layers 108. In some embodiments, the etching process is an isotropic etching such as dry chemical etching, remote plasma etching, wet chemical etching, another suitable technique, and/or a combination thereof.

Afterwards, as shown in FIG. 1G, inner spacers 134 are formed in the notches 132 between the second semiconductor material layers 108, in accordance with some embodiments. The inner spacers 134 are configured to separate the source/drain structures and the gate structures formed in subsequent manufacturing processes in accordance with some embodiments. In some embodiments, the inner spacers 134 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the inner spacer layer 134 is formed by a deposition process, such as chemical vapor deposition (CVD) process, atomic layer deposition (ALD) process, another applicable process, or a combination thereof.

Next, as shown in FIG. 1H, after the inner spacers 134 are formed, source/drain (S/D) structures 136 are formed in the S/D recess 130, in accordance with some embodiments. The topmost surface of the S/D structure 136 is lower than the topmost surface of the inner spacer 134. In addition, the topmost surface of the S/D structure 136 is lower than the topmost surface of the fin spacer layer 128.

In some embodiments, the S/D structures 136 are formed using an epitaxial growth process, such as Molecular beam epitaxy (MBE), Metal-organic Chemical Vapor Deposition (MOCVD), Vapor-Phase Epitaxy (VPE), other applicable epitaxial growth process, or a combination thereof. In some embodiments, the S/D structures 136 are made of any applicable material, such as Ge, Si, GaAs, AlGaAs, SiGe, GaAsP, SiP, SiC, SiCP, or a combination thereof.

In some embodiments, the S/D structures 136 are in-situ doped during the epitaxial growth process. For example, the S/D structures 136 may be the epitaxially grown SiGe doped with boron (B). For example, the S/D structures 136 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the S/D structures 136 are doped in one or more implantation processes after the epitaxial growth process.

Afterwards, as shown in FIG. 1I, after the S/D structures 136 are formed, an etching stop layer 138 is conformally formed to cover the S/D structures 136 and an interlayer dielectric (ILD) layer 140 is formed over the contact etch stop layers 138, in accordance with some embodiments.

In some embodiments, the etching stop layer 138 is made of a dielectric materials, such as silicon nitride, silicon oxide, silicon oxynitride, another suitable dielectric material, or a combination thereof. The dielectric material for the etching stop layer 138 may be conformally deposited over the semiconductor structure by performing chemical vapor deposition (CVD), ALD, other application methods, or a combination thereof. In some embodiments, the etching stop layer 138 has a thickness in a range from about 1 nm to about 5 nm.

The ILD layer 140 may include multilayers made of multiple dielectric materials, such as silicon oxide, silicon nitride, silicon oxynitride, phosphosilicate glass (PSG), borophosphosilicate glass (BPSG), or another applicable low-k dielectric material. The ILD layer 140 may be formed by chemical vapor deposition (CVD), physical vapor deposition, (PVD), atomic layer deposition (ALD), or another applicable process.

After the etching stop layer 138 and the ILD layer 140 are deposited, a planarization process such as CMP or an etch-back process may be performed until the gate electrode layer 120 of the dummy gate structure 118 is exposed, as shown in FIG. 1I, in accordance with some embodiments.

FIGS. 1J to 1X show perspective views of the semiconductor structure 100*a* along the dummy gate structure 118 along line $Y_1$-$Y_1$' in FIG. 1I, in accordance with some embodiments.

Next, as shown in FIG. 1J, a portion of the dummy gate structure 118 is removed to form a trench 141, in accordance with some embodiments. More specifically, a top portion of the dummy gate electrode layer 122 and a portion of the dummy gate dielectric layer 120 are removed by using the protective layer 129 as the etching stop layer. Next, a portion of the protective layer 129 is removed. Next, the bottom portion of the dummy gate electrode layer 122 is removed by using the patterned protective layer 129 as the mask.

When the portion of the dummy gate electrode layer 122 is removed, the fin structures 104*a*/104*b*/104*c*/104*d* are protected by the protective layer 129 and not removed. As a result, the top surface of the isolation structure 116 is exposed. In addition, the sidewall surfaces of the fin structures 104*a*/104*b*/104*c*/104*d* are exposed. Since the protective layer 129 protects the underlying layers, the trench 141 is self-aligned formed. If no protective layer on the fin structures 104*a*/104*b*/104*c*/104*d*, the fin structures 104*a*/104*b*/104*c*/104*d* may be damaged during the etching process for forming the trench 141 due to the overlay shift (misalignment) of the photolithography. The overlay shift (misalignment) is resolved by formation of the protective layer 129.

Afterwards, as shown in FIG. 1K, a liner layer 142 and a dielectric structure 144 are filled into the trench 141, in accordance with some embodiments. The liner layer 142 is in direct contact with the protective layer 129, the first semiconductor layers 106 and the second semiconductor layers 108 of the fin structures 104*a*/104*b*/104*c*/104*d*.

It should be noted that the dielectric structure 142 is between two adjacent fin structure 104*b* and the fin structure 104*c*. In addition, the dielectric structure 142 penetrates through the protective layer 129. The dielectric structure 142 has a top portion and a bottom portion, and the top portion is wider than the bottom portion.

The dielectric structure 144 has a T-shaped structure with main portion and extending portions extended from the main portion. The main portion of the dielectric structure 144 is surrounded by the oxide layer 142, and the oxide layer 142 is between the nanostructure 108' and the dielectric structure 144. The extending portions of the dielectric structure 144 are directly above the gate electrode layer 156 of the gate structure 150. The dielectric structure 144 penetrates through the protective layer 129. In other words, the protective layer 129 is between the extending portions of the dielectric structure 144 and the gate electrode layer 156 of the gate structure 150.

In some embodiments, the liner layer 142 is made of oxide layer. In some embodiments, the liner layer 142 is formed by chemical vapor deposition (CVD), physical vapor deposition, (PVD), atomic layer deposition (ALD), or another applicable process.

In some embodiments, the dielectric structure 144 is made of silicon nitride (SiN), silicon carbon nitride (SiCN), silicon oxycarbide (SiOC), silicon oxide carbonitride (SiOCN), or a combination thereof. In some embodiments, the dielectric structure 144 is formed by chemical vapor deposition (CVD), physical vapor deposition, (PVD), atomic layer deposition (ALD), or another applicable process.

Next, as shown in FIG. 1L, another portion of the dummy gate structure 118 is removed to form a trench 147, in accordance with some embodiments. More specifically, another portion of the gate electrode layer 122 is removed by the removal process. As a result, another portion of the dummy gate dielectric layer 120 is exposed. It should be noted that the liner layer 142 and the dielectric structure 144 are not removed when another portion of the dummy gate structure 118 is removed.

The removal process may include one or more etching processes. For example, when the dummy gate electrode layers 122 are polysilicon, a wet etchant such as a tetramethylammonium hydroxide (TMAH) solution may be used to selectively remove the dummy gate electrode layers 122.

Afterwards, as shown in FIG. 1M, the exposed dummy gate dielectric layer 120 is removed, in accordance with some embodiments. Furthermore, the exposed liner layer 142 is also removed. As a result, the top surface and the sidewall surface of the protective layer 129 are exposed. The remaining liner layer 142 is between two adjacent fin structures 104*b* and the fin structure 104*c*. In addition, the sidewall surfaces of the fin structures 104 are exposed. The dummy gate dielectric layer 120 may be removed using a plasma dry etching, a dry chemical etching, and/or a wet etching.

Next, as shown in FIG. 1N, the exposed sidewall portions of the fin structures 104*a*/104*b*/104*c*/104*d* are removed to form a recess 149, in accordance with some embodiments. More specifically, the sidewall portions of the first semiconductor material layers 106 and sidewall portions of the second semiconductor layers 108 are removed. However, the protective layer 129 is not removed. The sidewall surface of the protective layer 129 extends beyond the sidewall surface of the fin structures 104*a*/104*b*/104*c*/104*d*. More specifically, the sidewall surface of the protective layer 129 extends beyond the sidewall surface of the first semiconductor material layer 106 and the sidewall surface of the second semiconductor material layer 108.

Afterwards, as shown in FIG. 1O, the first semiconductor material layers 106 are removed to form nanostructures 108' with the second semiconductor material layers 108, in accordance with some embodiments. The S/D structure 136 is attached to the nanostructures 108'. In addition, a portion of the liner layer 142 is exposed when the first semiconductor material layers 106 are removed.

The first semiconductor material layers 106 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions. In some embodiments, the upper portions of the gate spacer layers 126 are also removed.

Next, as shown in FIG. 1P, after the nanostructures 108' are formed, the exposed liner layer 142 is removed, in accordance with some embodiments. The remaining liner layer 142 is between and in direct contact with the nanostructures 108' and the dielectric structure 144.

Afterwards, as shown in FIG. 1Q, an interfacial layer 152 is formed to surround the nanostructures 108', and then a gate dielectric layer 154 is formed on the interfacial layer 152, the isolation structure 116, the dielectric structure 144 and the protective layer 129, in accordance with some embodiments. More specifically, the gate dielectric layer 154 is in direct contact with the protective layer 129, the dielectric structure 144, the isolation structure 116 and the interfacial layer 152.

It should be noted that the gate dielectric layer 154 is conformally formed on the interfacial layer 152, the isolation structure 116, the dielectric structure 144 and the protective layer 129, and therefore the gate dielectric layer 154 does not completely fill the trench 147. The trench 147 remains. It should be noted that the gate dielectric layer 154 is in direct contact with the dielectric structure 144 and the oxide layer 142. In addition, the gate dielectric layer 154 is in direct contact with the sidewall surfaces of the protective layer 129.

In some embodiments, the interfacial layers 152 are oxide layers formed around the nanostructures 108' and on the top of the base fin structure 105. In some embodiments, the interfacial layers 152 are formed by performing a thermal process.

In some embodiments, the gate dielectric layer 154 is formed over the interfacial layers 152, so that the nanostructures 108' are surrounded (e.g. wrapped) by the gate dielectric layer 154. In addition, the gate dielectric layer 154 also covers the sidewalls of the gate spacer layers 126 and the inner spacers 134 in accordance with some embodiments. In some embodiments, the gate dielectric layer 154 is made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al2O_3$) alloy, another suitable high-k dielectric material, or a combination thereof. In some embodiments, the gate dielectric layer 154 is formed using chemical vapor deposition (CVD), atomic layer deposition (ALD), another applicable method, or a combination thereof.

Next, as shown in FIG. 1R, a gate electrode layer 156 is formed on the gate dielectric layer 154, in accordance with some embodiments. A gate structure 150 is constructed by the interfacial layer 152, the gate dielectric layer 154 and the gate electrode layer 156. It should be noted that the gate electrode layer 156 is conformally formed on the gate dielectric layer 154, and therefore the trench 147 remains as it is not completely filled by the gate electrode layer 156.

In some embodiments, the gate electrode layer 156 is formed on the gate dielectric layer 154. In some embodiments, the gate electrode layer 156 is made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layer 156 is formed using chemical vapor deposition (CVD), atomic layer deposition (ALD), electroplating, another applicable method, or a combination thereof.

Other conductive layers, such as work function metal layers, may also be formed in the gate structures 150, although they are not shown in the figures. In some embodiments, the n-work function layer includes tungsten (W), copper (Cu), titanium (Ti), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium (Ti), titanium nitride (TiN), tantalum nitride (TaN), tantalum carbide (TaC), molybdenum nitride, tungsten nitride (WN), ruthenium (Ru) or a combination thereof.

After the interfacial layers 152, the gate dielectric layer 154, and the gate electrode layer 156 are formed, a planarization process such as CMP or an etch-back process may be performed until the dielectric structure 144 is exposed.

Afterwards, as shown in FIG. 1S, a mask structure 164 is formed in trench 147 and then the mask structure 164 is patterned, in accordance with some embodiments. The patterned mask structure 164 has an opening 165 to expose a portion of the gate electrode layer 156. In addition, the mask structure 164 has a remaining portion 164R which is directly below the protective layer 129.

As mentioned above, the sidewall surface of the protective layer 129 extends beyond the sidewall surface of the fin structures 104*a*/104*b*/104*c*/104*d*. More specifically, the sidewall surface of the protective layer 129 extends beyond the sidewall surface of the nanostructures 108'. Therefore, there is the recess 149 directly below the protective layer 129, and the recess 149 is filled with the remaining portion 164R of the mask structure 164.

Next, as shown in FIG. 1T, the exposed gate electrode layer 156 which is not protected by the mask structure 164 is removed to expose a portion of the gate dielectric layer 154, in accordance with some embodiments. As a result, a portion of the protective layer 129, and a portion of the remaining portion 164R of the mask structure 164 are exposed.

Afterwards, as shown in FIG. 1U, the mask structure 164 is removed, in accordance with some embodiments. As a result, the recess 149 and the trench 147 are exposed again. The recess 149 is directly below the protective layer 129 and adjacent to the nanostructures 108'.

Next, as shown in FIG. 1V, a conductive layer 172 is formed in the recess 149 and in the trench 147, in accordance with some embodiments. It should be noted that the conductive layer 172 is selectively formed on by a selectively deposition process, and therefore the conductive layer 172 is selectively formed on the gate electrode layer 156. As a result, the conductive layer 172 is formed on the surface of the conductive material, and not formed on the surface of the non-conductive material. More specifically, the conductive layer 172 is not formed on the protective layer 129. In addition, an opening 173 is formed when the trench 147 is not completely filled with the conductive layer 172.

The conductive layer 172 and the gate electrode layer 156 are made of different materials. There is in interface between the conductive layer 172 and the gate electrode layer 156. The conductive layer 172 has a top portion and a bottom portion, and the bottom portion is wider than the top portion.

In some embodiments, the conductive layer 172 is made of a conductive material including aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof. In some embodiments, the conductive layer 172 is made of tungsten (W) free from fluorine (F).

The conductive layer 172 may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

Afterwards, as shown in FIG. 1W, a dielectric structure 174 is formed in the opening 173, in accordance with some embodiments. Afterwards, a planarization process such as CMP or an etch-back process may be performed until the protective layer 129 is exposed. The conductive layer 172 is on sidewall surfaces of the dielectric structure 174.

The dielectric structure 174 penetrates through the protective layer 129. The gate dielectric layer 154 is between the protective layer 129 and the gate electrode layer 156 The dielectric structure 174 is directly over the isolation structure 116. The gate dielectric layer 154 is between the dielectric structure 174 and the isolation structure 116. The top surface of the dielectric structure 174 is higher than the topmost surface of the gate electrode layer 156 of the gate structure 150.

In some embodiments, the dielectric structure 174 is made of silicon nitride (SiN), silicon carbon nitride (SiCN), silicon oxycarbide (SiOC), silicon oxide carbonitride (SiOCN), or a combination thereof. In some embodiments, the dielectric structure 174 is formed by chemical vapor deposition (CVD), physical vapor deposition, (PVD), atomic layer deposition (ALD), or another applicable process.

Next, as shown in FIG. 1X, an etching stop layer 178 is formed on the dielectric structure 174, the dielectric structure 144, the protective layer 129, and a dielectric layer 180 is formed on the etching stop layer 178, in accordance with some embodiments.

In some embodiments, the etching stop layer 178 is made of a dielectric material, such as silicon nitride, silicon oxide, silicon oxynitride, another suitable dielectric material, or a combination thereof. The dielectric material for the etching stop layer 178 may be conformally deposited over the semiconductor structure by performing chemical vapor deposition (CVD), ALD, other application methods, or a combination thereof.

The dielectric layer 180 may include multilayers made of multiple dielectric materials, such as silicon oxide, silicon nitride, silicon oxynitride, phosphosilicate glass (PSG), borophosphosilicate glass (BPSG), or another applicable low-k dielectric material. The dielectric layer 180 may be formed by chemical vapor deposition (CVD), physical vapor deposition, (PVD), atomic layer deposition (ALD), or another applicable process.

Next, a gate contact structure 182 is formed over the gate electrode layer 156. The gate contact structure 182 penetrates through the protective layer 129 and in direct contact with the gate electrode layer 156.

In some embodiments, the gate contact structure 182 is made of a conductive material including aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof.

The gate contact structure 182 may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

Figure 2:
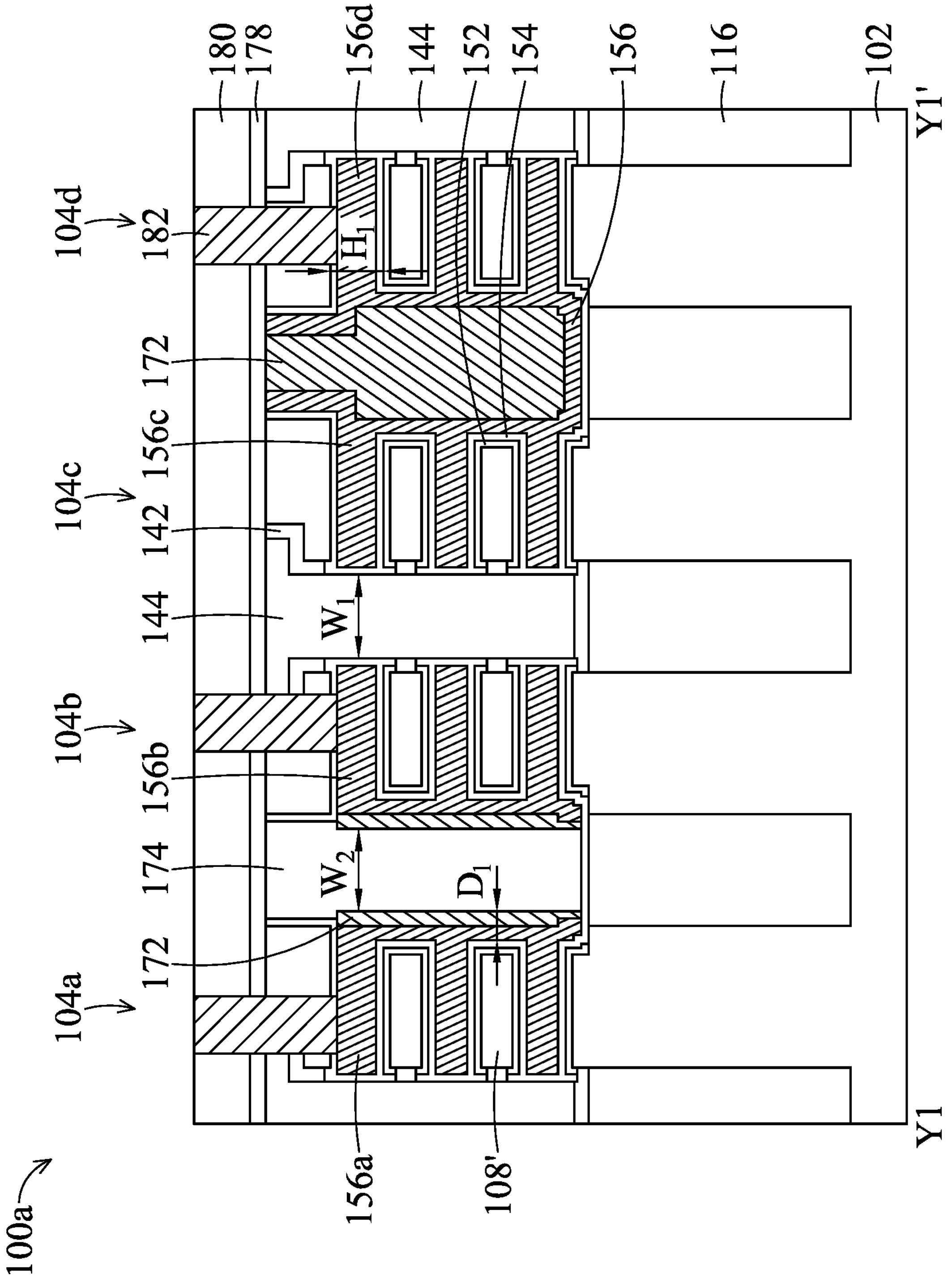
FIG. 2 shows a cross-sectional representation of the semiconductor structure shown along line $Y_1$-$Y_1$' in FIG. 1I, in accordance with some embodiments.

FIG. 2 shows a cross-sectional representation of the semiconductor structure 100*a* shown along line $Y_1$-$Y_1$' in FIG. 1I, in accordance with some embodiments.

The gate electrode layer 156 includes a first part 156*a*, a second part 156*b*, third part 156*c* and a fourth part 156*d*. As shown in FIG. 2, the dielectric structure 174 is between the nanostructure 108' of the fin structure 104*a* and the nanostructure 108' of the fin structure 104*b*. The dielectric structure 174 is between the first part 156*a* of the gate electrode layer 156 and the second part 156*b* of the gate electrode layer 156.

The dielectric structure 174 penetrates through the protective layer 129. The gate dielectric layer 154 is between the protective layer 129 and the gate electrode layer 156 The dielectric structure 174 is directly over the isolation structure 116. The gate dielectric layer 154 is between the dielectric structure 174 and the isolation structure 116. The top surface of the dielectric structure 174 is higher than the topmost surface of the gate electrode layer 156 of the gate structure 150.

As shown in FIG. 2, the dielectric structure 144 is between the nanostructure 108' of the fin structure 104*b* and the nanostructure 108' of the fin structure 104*c*. The dielectric structure 144 is between the second part 156*b* of the gate electrode layer 156 and the third part 156*c* of the gate electrode layer 156. The dielectric structure 144 has a T-shaped structure with main portion and extending portions extended from the main portion. The main portion of the dielectric structure 144 is surrounded by the oxide layer 142, and the oxide layer 142 is between the nanostructure 108' and the dielectric structure 144.

The extending portions of the dielectric structure 144 are directly above the gate electrode layer 156 of the gate structure 150. The dielectric structure 144 penetrates through the protective layer 129. In other words, the protective layer 129 is between the extending portions of the dielectric structure 144 and the gate electrode layer 156 of the gate structure 150.

As shown in FIG. 2, the third part 156*c* of the gate electrode layer 156 surrounding the nanostructures 108' of the fin structure 104*c* is connected to the fourth part 156*d* of the gate electrode layer 156 surrounding the nanostructure 108' of the fin structure 104*d* by the conductive layer 172. The conductive layer 172 is between the third part 156*c* of the gate electrode layer 156 and the fourth part 156*d* of the gate electrode layer 156. A portion of the gate electrode layer 156 is directly below the conductive layer 172. In addition, a portion of the gate dielectric layer 154 is directly conductive layer 172. The portion of the gate dielectric layer 154 is in direct contact with the isolation structure 116.

The topmost surface of the third part 156*c* of the gate electrode layer 156 of the gate structure 150 is higher than the topmost surface of the second part 156*b* of the gate electrode layer 156 of the gate structure 150.

As shown in FIG. 2, the dielectric structure 144 has a first width $W_1$ along the Y-axis. In some embodiments, the first width $W_1$ of the dielectric structure 144 is in a range from about 10 nm to about 30 nm. The dielectric structure 174 has a second width $W_2$ along the Y-axis. In some embodiments, the second width $W_2$ of the dielectric structure 174 is in a range from about 15 nm to about 100 nm. There is a first height $H_1$ between the top surface of the topmost nanostructure 108' and the top surface of the gate electrode layer 156. In some embodiments, the first height $H_1$ is in a range from about 4 nm to about 10 nm. There is a first distance $D_1$ between the sidewall surface of the gate dielectric layer 154 and the sidewall surface of the dielectric structure 174. In some embodiments, the first distance $D_1$ is in a range from about 3 nm to about 10 nm.

It should be noted that the nanostructures 108' of the fin structure 104*a* is separated from the nanostructure 108' of the fin structure 104*b* by the dielectric structure 174. In addition, the first part 156*a* of the gate electrode layer 156 surrounding the nanostructures 108' of the fin structure 104*a* is separated from the second part 156*b* of the gate electrode layer 156 surrounding the nanostructure 108' of the fin structure 104*b* by the dielectric structure 174. By inserting the dielectric structure 174, the first distance $D_1$ is further deduced. Therefore, the unwanted capacitance is reduced, and the performance of the semiconductor structure 100*a* is improved.

The nanostructures 108' of the fin structure 104*b* is separated from the nanostructure 108' of the fin structure 104*c* by the dielectric structure 144. The second part 156*b* of the gate electrode layer 156 surrounding the nanostructures 108' of the fin structure 104*b* is separated from the third part 156*c* of the gate electrode layer 156 surrounding the nanostructure 108' of the fin structure 104*c* by the dielectric structure 144.

Figure 3:
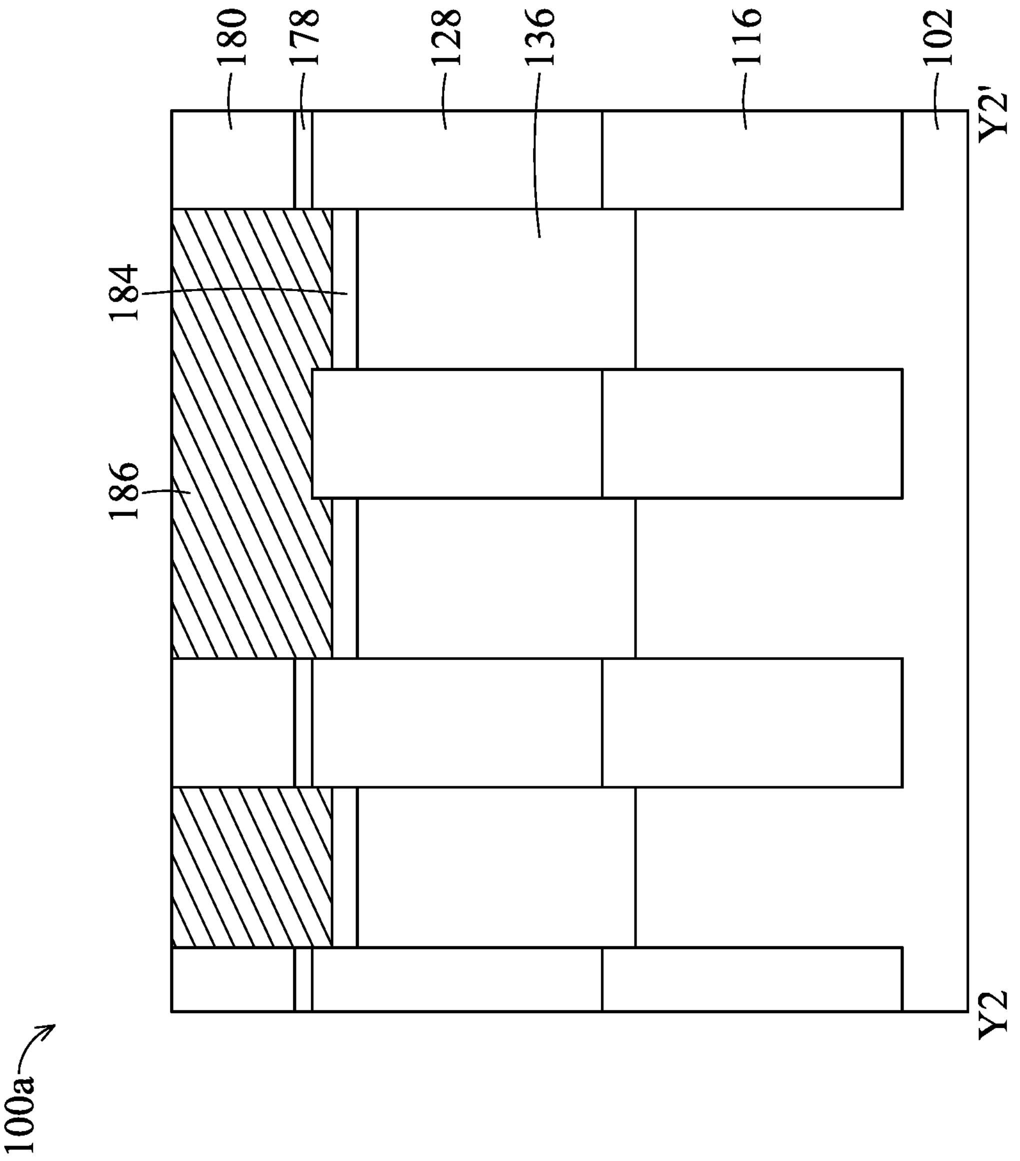
FIG. 3 shows a cross-sectional representation of the semiconductor structure shown along the Y-axis in FIG. 1X and along line $Y_2$-$Y_2$' in FIG. 1I, in accordance with some embodiments.

FIG. 3 shows a cross-sectional representation of the semiconductor structure 100*a* shown along the Y-axis in FIG. 1X and along line $Y_2$-$Y_2$' in FIG. 1I, in accordance with some embodiments.

As shown in FIG. 3, a silicide layer 184 is formed over the S/D structure 136, and an S/D contact structure 186 is formed over the silicide layer 184. The silicide layer 184 may be formed by forming a metal layer over the top surface of the S/D structures 136 and annealing the metal layer so the metal layer reacts with the S/D structures 136 to form the silicide layer 184. The unreacted metal layer may be removed after the silicide layer 184 is formed.

In some embodiments, the S/D contact structure 186 is made of a conductive material including aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof. In addition, a glue layer may formed between the silicide layer 184 and the S/D contact structure 186. In some embodiments, the glue layer (not shown) is made of tantalum nitride, although other materials, such as tantalum, titanium, titanium nitride, or the like, may also be used.

Figure 4:
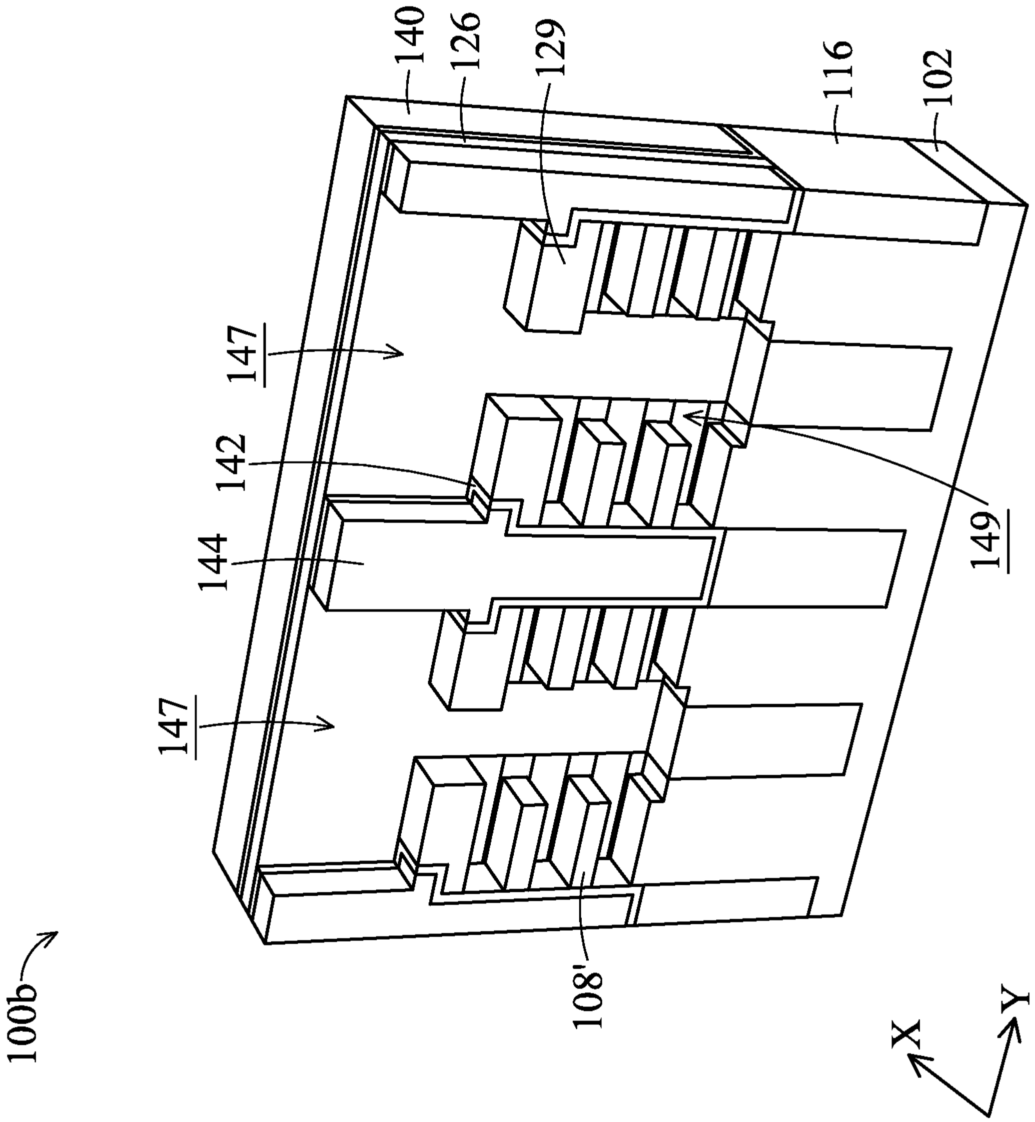
FIG. 4 shows a perspective view of a semiconductor structure, in accordance with some embodiments.

FIG. 4 shows a perspective view of a semiconductor structure 100*b*, in accordance with some embodiments. The semiconductor structure 100*b* of FIG. 4 includes elements that are similar to, or the same as, elements of the semiconductor structure 100*a* of FIG. 1O. Materials and processes for forming the semiconductor structure 100*b* may be similar to, or the same as, those for forming the semiconductor structure 100*a* described above and are not repeated herein.

As shown in FIG. 4, the dielectric structure 144 is formed between two adjacent fin structure 104*b* and the fin structure 104*c*. The oxide layer 142 is formed before the dielectric structure 144 is formed. The oxide layer 142 is not removed at the following steps. The oxide layer 142 is connected to and in direct contact with the nanostructures 108'. The oxide layer 142 has a U-shaped structure. The bottommost surface of the oxide layer 142 is in direct contact with the isolation structure 116.

Figure 5:
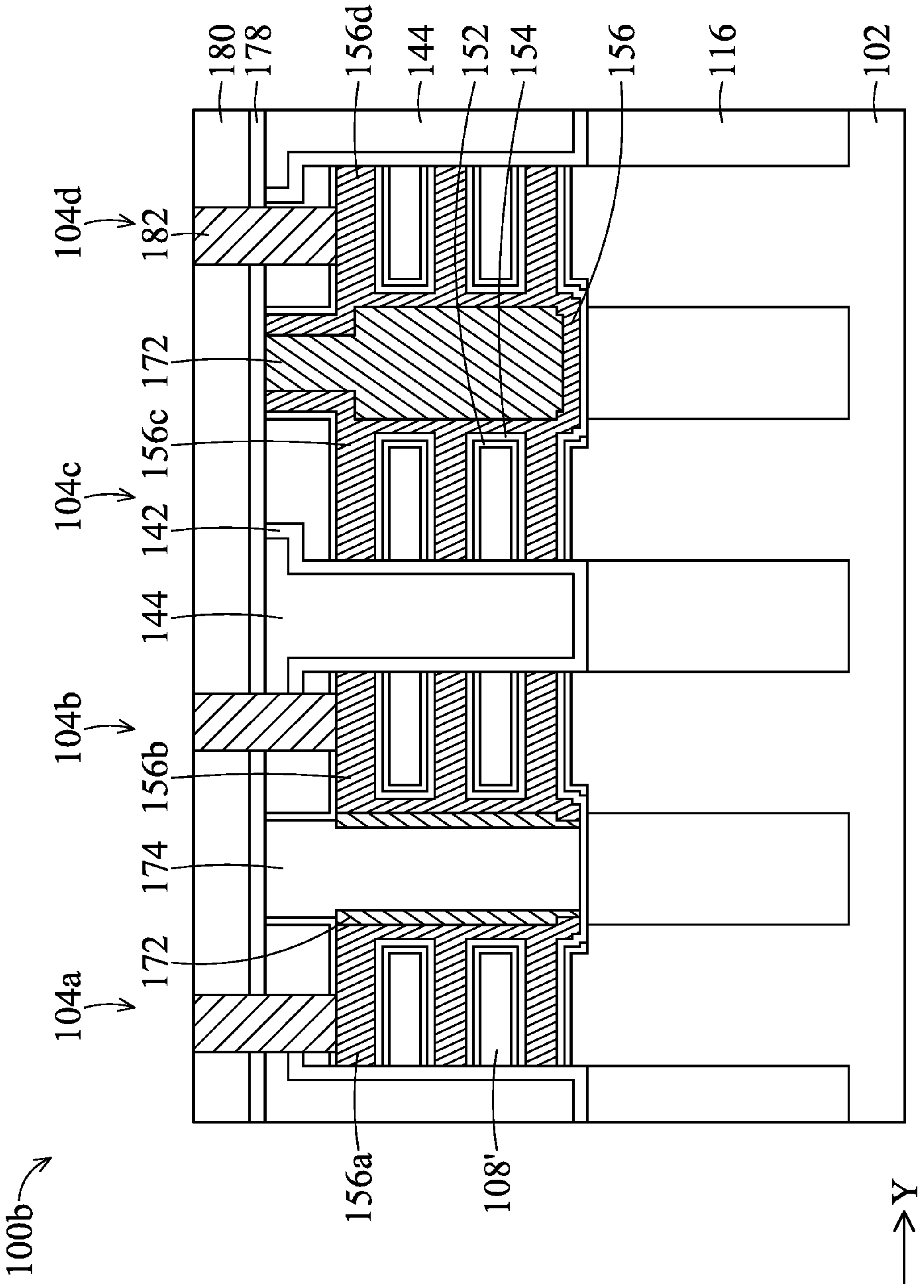
FIG. 5 shows a cross-sectional representation of the semiconductor structure, in accordance with some embodiments.

FIG. 5 shows a cross-sectional representation of the semiconductor structure 100*b*, in accordance with some embodiments. The semiconductor structure 100*b* of FIG. 5 includes elements that are similar to, or the same as, elements of the semiconductor structure 100*a* of FIG. 1X. The difference between semiconductor structure 100*b* of FIG. 5 and the semiconductor structure 100*a* of FIG. 1X is the oxide layer 142 is not removed, and is a continuous layer between the nanostructure 108' and the dielectric structure 144. The oxide layer 142 has a U-shaped structure and in direct contact with the nanostructure 108'.

Figure 6:
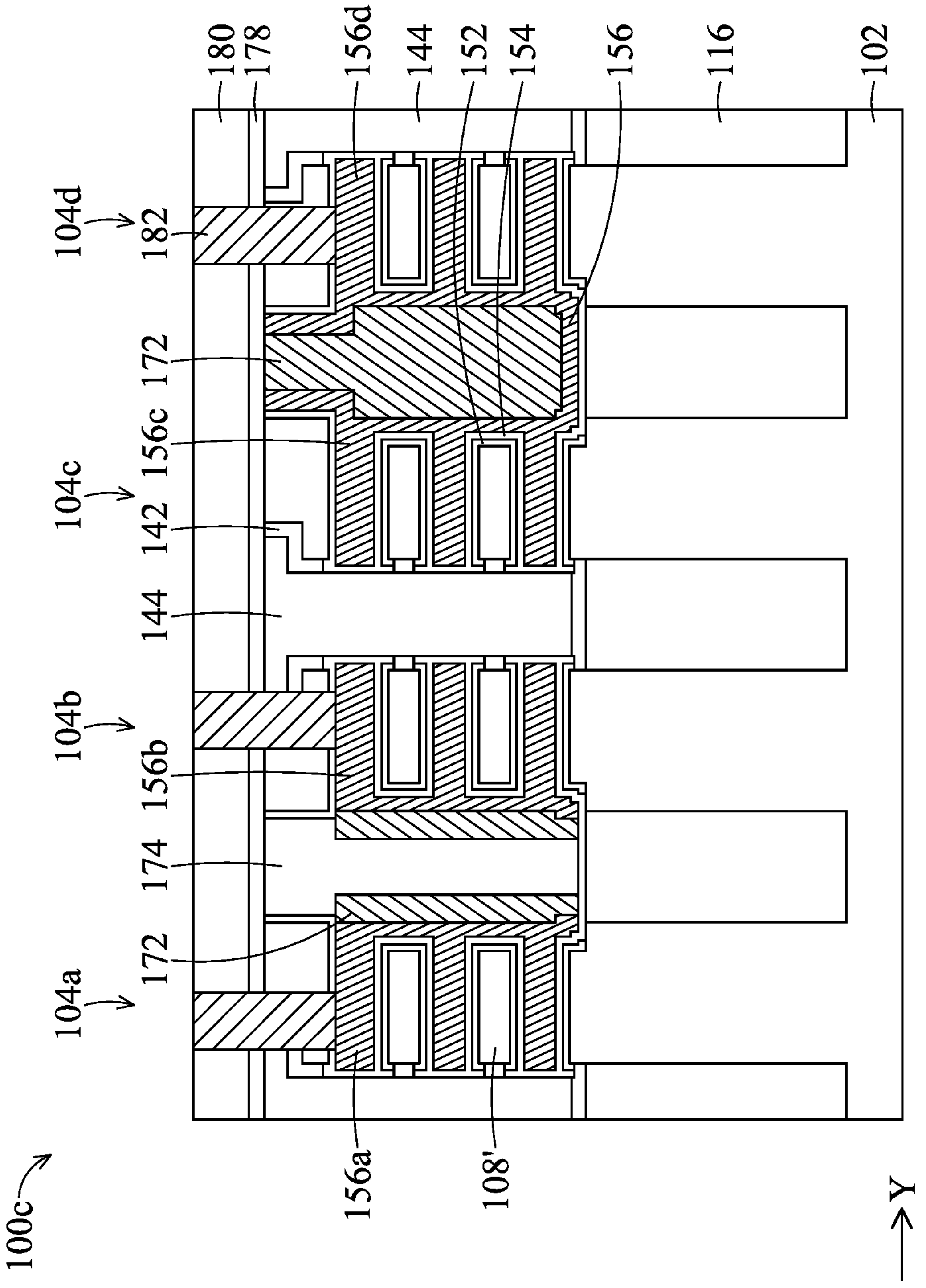
FIG. 6 shows a cross-sectional representation of the semiconductor structure, in accordance with some embodiments.

FIG. 6 shows a cross-sectional representation of the semiconductor structure 100*c*, in accordance with some embodiments. The semiconductor structure 100*c* of FIG. 6 includes elements that are similar to, or the same as, elements of the semiconductor structure 100*a* of FIG. 1X. Materials and processes for forming the semiconductor structure 100*c* may be similar to, or the same as, those for forming the semiconductor structure 100*a* described above and are not repeated herein.

The difference between semiconductor structure 100*c* of FIG. 7 and the semiconductor structure 100*a* of FIG. 1X is that the conductive layer 172 on two sidewall surfaces of the dielectric structure 174 is thicker. The conductive layer 172 is selectively formed on the gate electrode layer 156, and the thickness of the conductive layer 172 can be controlled according to actual needs.

The dielectric structure 174 is between the nanostructures 108' of the fin structure 104*a* and the nanostructures 108' of the fin structure 104*b*. The gate dielectric layer 154 is directly below the dielectric structure 174.

The dielectric structure 144 is between the nanostructures 108' of the fin structure 104*b* and the nanostructures 108' of the fin structure 104*c*. The oxide layer 142 is directly below the dielectric structure 144.

The nanostructures 108' of the fin structure 104*b* is connected to the nanostructures 108' of the fin structure 104*c* by the conductive layer 172. The conductive layer 172 has a top portion and a bottom portion, and the bottom portion is wider than the top portion.

It should be appreciated that the semiconductor structures 100*a* to 100*c* having the dielectric structure 144, 174 passing through the protective layer 129 described above may also be applied to FinFET structures, similar to that shown in FIG. 9, although not shown in the figures.

Also, while disclosed methods are illustrated and described below as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure includes forming nanostructures over a substrate. A first gate electrode layer is formed to wrap around the nanostructures, and a second gate electrode layer is formed adjacent to the first gate electrode layer. A protective layer is formed on the first gate electrode layer and the second gate electrode layer. A dielectric structure is formed between the first gate electrode layer and a second gate electrode layer. The dielectric structure passes through the protective layer. By forming the dielectric structure, the distance between the first gate electrode layer and the dielectric structure is reduced, and the distance between two adjacent nanostructures is reduced. Therefore, the unwanted capacitor is reduced. Accordingly, the performance of the semiconductor structure is improved.

In some embodiments, a semiconductor structure is provided. The semiconductor structure includes first nanostructures formed over a substrate, and a first gate electrode layer formed on the first nanostructures. The semiconductor structure includes a second gate electrode layer adjacent to the first gate electrode layer, and a protective layer formed over the first gate electrode layer and the second gate electrode layer. The semiconductor structure includes a first dielectric structure between the first gate electrode layer and the second gate electrode layer, and the first dielectric structure penetrates through the protective layer.

In some embodiments, a semiconductor structure is provided. The semiconductor structure includes first nanostructures formed over a substrate, and second nanostructures formed adjacent to the first nanostructures. The semiconductor structure includes a first gate electrode layer formed on the first nanostructures, and a second gate electrode layer adjacent to the first gate electrode layer. The semiconductor structure includes a first dielectric structure has an extending portion, and the extending portion of the first dielectric structure is directly over the first gate electrode layer. The semiconductor structure includes a protective layer between the first gate electrode layer and the extending portion of the first dielectric structure.

In some embodiments, a method for forming a semiconductor structure is provided. The method includes forming a first fin structure and a second fin structure over a substrate, respectively. The first fin structure includes first semiconductor material layers and second semiconductor material layers alternately stacked, and the second fin structure includes first semiconductor material layers and second semiconductor material layers alternately stacked. The method also includes forming a dummy gate structure over and between the first fin structure and the second fin structure, and removing a topmost first semiconductor layer and a topmost second semiconductor layer to form a recess. The method includes forming a protective layer in the recess, and the protective layer is formed over the first fin structure and the second fin structure. The method includes removing a portion of the dummy gate structure to expose a trench between the first fin structure and the second fin structure. The method also includes forming an oxide layer and a dielectric structure in the trench, and the dielectric structure is between the first fin structure and the second fin structure, and the dielectric structure is through the protective layer. The method includes removing the second semiconductor material layers to expose the first semiconductor material layers and forming a gate structure to surround the first semiconductor material layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:

forming a first fin structure and a second fin structure over a substrate, wherein the first fin structure comprises first semiconductor material layers and second semiconductor material layers alternately stacked, and the second fin structure comprises first semiconductor material layers and second semiconductor material layers alternately stacked;

forming a dummy gate structure over and between the first fin structure and the second fin structure;

removing a topmost first semiconductor layer and a topmost second semiconductor layer to form a recess;

forming a protective layer in the recess, wherein the protective layer is formed over the first fin structure and the second fin structure;

removing a portion of the dummy gate structure to expose a trench between the first fin structure and the second fin structure;

forming an oxide layer and a first dielectric structure in the trench, wherein the first dielectric structure is between the first fin structure and the second fin structure, and the first dielectric structure is through the protective layer;

removing the first semiconductor material layers to expose the second semiconductor material layers; and forming a gate structure to surround the second semiconductor material layers.

2. The method for forming the semiconductor structure as claimed in claim 1, further comprising:

forming a third fin structure adjacent to the second fin structure, wherein the third fin structure comprises first semiconductor material layers and second semiconductor material layers alternately stacked;

forming the dummy gate structure over the third fin structure;

forming the protective layer over the third fin structure;

removing the second semiconductor material layers of the third fin structure to expose the first semiconductor material layers of the third fin structure;

forming the gate structure to surround the first semiconductor material layers of the third fin structure; and forming a conductor layer between the first semiconductor material layers of the second fin structure and the first semiconductor material layers of the third fin structure.

3. The method for forming the semiconductor structure as claimed in claim 1, further comprising:

removing a portion of the oxide layer to expose a sidewall surface of the first dielectric structure; and forming a gate dielectric layer on the sidewall surface of the first dielectric structure.

4. The method for forming the semiconductor structure as claimed in claim 1, further comprising:

removing a portion of the first fin structure and a portion of the second fin structure, wherein a sidewall surface of the protective layer extends beyond a sidewall surface of the first fin structure.

5. The method for forming the semiconductor structure as claimed in claim 1, wherein the first dielectric structure has an extending portion which is directly above the gate structure.

6. The method for forming the semiconductor structure as claimed in claim 1, further comprising:

removing a portion of the gate structure to form a trench; and forming a second dielectric structure in the trench, wherein a top surface of the second dielectric structure is higher than a top surface of the protective layer.

7. The method for forming the semiconductor structure as claimed in claim 1, further comprising:

removing the second semiconductor material layers to form a plurality of nanostructures, wherein a top surface of the first dielectric structure is higher than a topmost surface of the nanostructures.

8. The method for forming the semiconductor structure as claimed in claim 1, further comprising:

forming an isolation structure over the substrate, wherein the first dielectric structure is on the isolation structure.

9. The method for forming the semiconductor structure as claimed in claim 1, further comprising:

forming a gate contact structure on the gate structure, wherein the gate contact structure is through the protective layer.

10. The method for forming the semiconductor structure as claimed in claim 1, further comprising:

removing a portion of the first fin structure to form a notch; and forming an inner spacer layer in the notch, wherein the protective layer is higher than a topmost surface of the inner spacer layer.

11. A method for forming a semiconductor structure, comprising:

forming a first fin structure and a second fin structure over a substrate, wherein the first fin structure comprises first semiconductor material layers and second semiconductor material layers alternately stacked, and the second fin structure comprises first semiconductor material layers and second semiconductor material layers alternately stacked;

removing a topmost first semiconductor layer and a topmost second semiconductor layer to form a recess;

forming a protective layer in the recess;

forming a dummy gate structure on the first fin structure and the second fin structure;

removing a portion of the dummy gate structure and a portion of the protective layer to form a T-shaped trench;

forming a first dielectric structure in the T-shaped trench; and replacing the dummy gate structure with a gate structure.

12. The method for forming the semiconductor structure as claimed in claim 11, further comprising:

forming a liner layer in the T-shaped trench before forming the first dielectric structure.

13. The method for forming the semiconductor structure as claimed in claim 12, further comprising:

removing a portion of the liner layer before forming the gate structure.

14. The method for forming the semiconductor structure as claimed in claim 11, wherein the gate structure comprises a first portion and a second portion, and the first portion is separated from the second portion by the first dielectric structure.

15. The method for forming the semiconductor structure as claimed in claim 11, further comprising:

forming a gate contact structure on the gate structure, wherein the gate contact structure is through the protective layer.

16. A method for forming a semiconductor structure, comprising:

forming a first fin structure, a second fin structure and a third fin structure on a substrate, wherein the first fin structure, the second fin structure and the third fin structure, respectively, comprise first semiconductor material layers and second semiconductor material layers alternately stacked;

forming a dummy gate structure over the first fin structure, the second fin structure and the third fin structure;

removing a portion of the dummy gate structure to form a first dielectric structure between the second fin structure and the third fin structure;

removing another portion of the dummy gate structure to form a trench;

removing the second semiconductor material layers to form a plurality of nanostructures;

forming a gate structure in the trench, wherein the nanostructures are surrounded by the gate structure; and removing a portion of the gate structure to form a second dielectric structure, wherein the second dielectric structure is between the first fin structure and the second fin structure.

17. The method for forming the semiconductor structure as claimed in claim 16, further comprising:

forming a conductive layer on a portion of the gate structure.

18. The method for forming the semiconductor structure as claimed in claim 16, further comprising:

forming an isolation structure over the substrate, wherein the first dielectric structure and the second dielectric structure are on the isolation structure.

19. The method for forming the semiconductor structure as claimed in claim 16, further comprising:

forming a liner layer before forming the first dielectric structure; and removing a portion of the liner layer before forming the gate structure.

20. The method for forming the semiconductor structure as claimed in claim 16, further comprising:

removing a topmost first semiconductor layer and a topmost second semiconductor layer to form a recess; and forming a protective layer in the recess; and removing a portion of the protective layer before forming the first dielectric structure.

* * * * *